(12) United States Patent
Murashige et al.

(10) Patent No.: US 12,453,272 B2
(45) Date of Patent: Oct. 21, 2025

(54) DISPLAY DEVICE FOR PREVENTING CONDUCTIVE WALL LAYERS DELAMINATING FROM ONE ANOTHER AND METHOD FOR MANUFACTURING SAME

(71) Applicant: SHARP KABUSHIKI KAISHA, Sakai (JP)

(72) Inventors: Shogo Murashige, Sakai (JP); Yujiro Takeda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 580 days.

(21) Appl. No.: 17/914,506

(22) PCT Filed: Apr. 10, 2020

(86) PCT No.: PCT/JP2020/016081
§ 371 (c)(1),
(2) Date: Sep. 26, 2022

(87) PCT Pub. No.: WO2021/205635
PCT Pub. Date: Oct. 14, 2021

(65) Prior Publication Data
US 2023/0130571 A1   Apr. 27, 2023

(51) Int. Cl.
*H10K 59/80* (2023.01)
*H10K 59/131* (2023.01)
*H10K 59/12* (2023.01)

(52) U.S. Cl.
CPC ......... *H10K 59/873* (2023.02); *H10K 59/131* (2023.02); *H10K 59/1201* (2023.02); *H10K 59/8731* (2023.02)

(58) Field of Classification Search
CPC .. H10K 59/873; H10K 50/844; H10K 59/131; H10K 71/00; H10K 59/1201; H10K 59/8731; H05B 33/04; H05B 33/22
USPC ............................................. 257/40
See application file for complete search history.

(56) References Cited

U.S. PATENT DOCUMENTS

| | | |
|---|---|---|
| 2006/0158111 A1 | 7/2006 | Hayashi |
| 2020/0185647 A1* | 6/2020 | Lee ................ H10K 59/124 |
| 2021/0119178 A1* | 4/2021 | Song ............. H10K 59/8791 |
| 2021/0159453 A1 | 5/2021 | Takahashi et al. |

FOREIGN PATENT DOCUMENTS

| | | |
|---|---|---|
| JP | 2006222070 A | 8/2006 |
| WO | 2019186721 A1 | 10/2019 |

* cited by examiner

*Primary Examiner* — Norman D Richards
*Assistant Examiner* — Laura M Dykes
(74) *Attorney, Agent, or Firm* — ScienBiziP, P.C.

(57) ABSTRACT

An organic EL display device has a frame region provided with a first dam wall and a second dam wall to surround a display region. The first dam wall and the second dam wall include: a first resin wall layer; a first conductive wall layer covering the first resin wall layer; a second resin wall layer over the first resin wall layer through the first conductive wall layer; and a second conductive wall layer covering the second resin wall layer. The second resin wall layer is positioned between: a step portion included in the first conductive wall layer and covering a peripheral end face of the first resin wall layer; and a portion included in the second conductive wall layer and corresponding to the step portion of the first conductive wall layer.

15 Claims, 19 Drawing Sheets

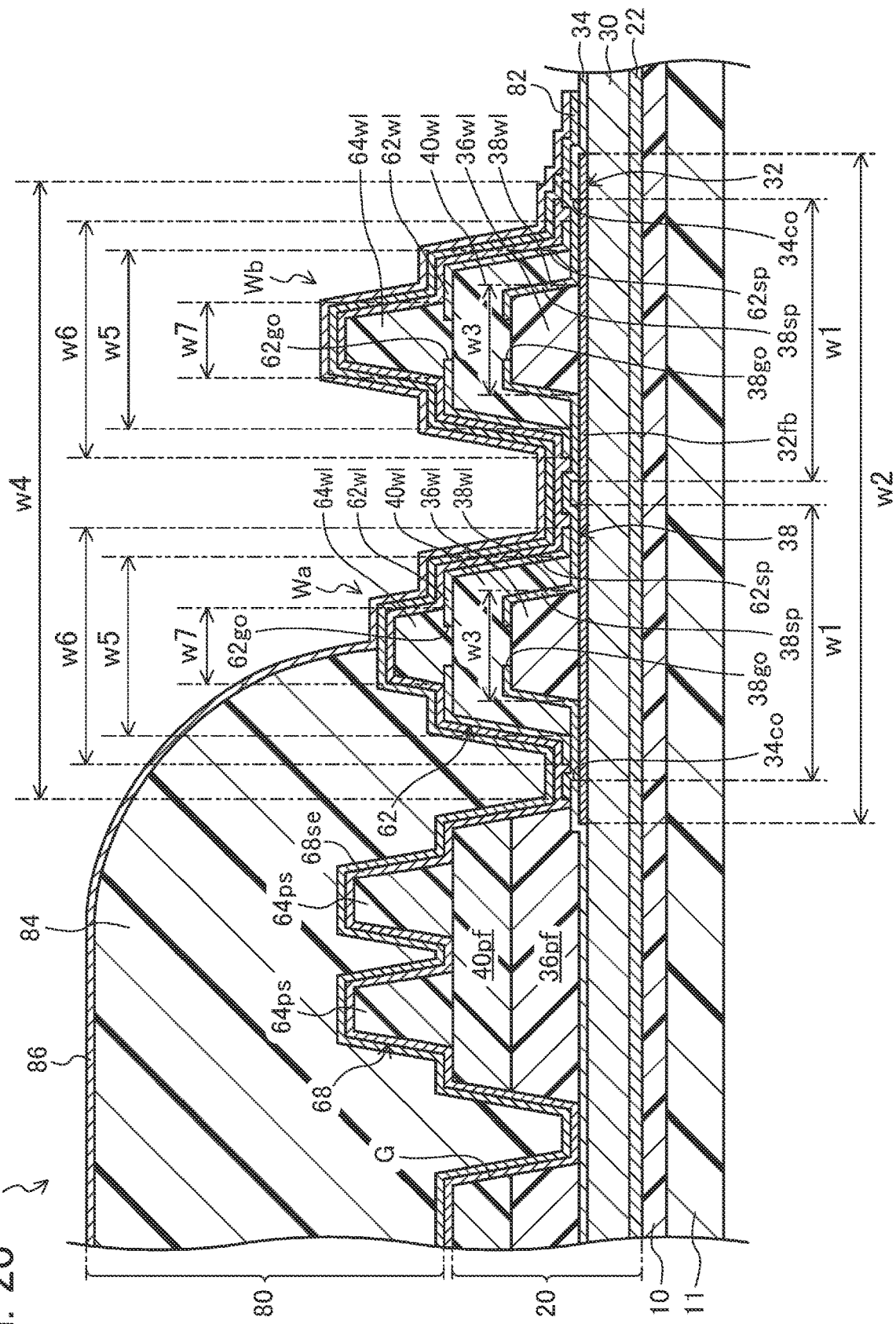

DISPLAY DEVICE FOR PREVENTING CONDUCTIVE WALL LAYERS DELAMINATING FROM ONE ANOTHER AND METHOD FOR MANUFACTURING SAME

TECHNICAL FIELD

The present disclosure relates to a display device and a method for manufacturing the display device.

BACKGROUND ART

In recent years, light-emitting organic electroluminescence (EL) display devices using organic EL elements are drawing attention as a replacement for liquid crystal display devices.

In an organic EL display device, a sealing film including an organic layer covers organic EL elements to reduce deterioration of the organic EL elements caused by infiltration of water and oxygen. The organic layer included in the sealing film is formed by, for example, ink-jet printing. An organic EL display device including such a sealing film is provided with a dam wall. When an organic material (ink) is applied to form the organic layer during a manufacturing process of the organic EL display device, the dam wall keeps the organic material from spreading out of a frame region (see, for example, Patent Document 1).

CITATION LIST

Patent Literature

[Patent Document 1] International Publication No. WO/2019/186721

SUMMARY

Technical Problems

In the above organic EL display device, the dam wall is often formed of photosensitive resin together with a planarization film and a photo spacer that constitute a display region. In order to have a height, the dam wall is formed of a plurality of resin wall layers stacked one another. The dam wall having such a multilayer structure does not have sufficient mechanical strength. That is why a conductive wall layer made of, for example, a metal material would be individually provided to the resin wall layers. However, if a plurality of the conductive wall layers overlap in a place where the conductive wall layers cover peripheral end faces of the resin wall layers, the overlapping conductive wall layers are likely to be delaminated from one another by thermal processing carried out after the formation of these conductive wall layers, because of, for example, a difference in thermal expansion coefficient. This results in a low yield in manufacturing organic EL display devices.

A technique of the present disclosure is conceived in view of the above points and directed to a display device. The technique is intended to provide a dam wall with a plurality of conductive wall layers to enhance mechanical strength of the dam wall, and to keep the conductive wall layers included in the dam wall from delaminating from one another.

Solution to Problems

A technique of the present disclosure is directed to a display device including: a thin-film transistor layer provided on the substrate and including a plurality of thin-film transistors; a light-emitting-element layer provided on the thin-film transistor layer and including a plurality of light-emitting elements; a sealing film provided on the light-emitting-element layer and including an organic layer. This display device includes: a display region that displays an image when the plurality of light-emitting elements emit light, and a frame region provided out of the display region. The frame region includes a dam wall to surround the display region. The organic layer is provided behind the dam wall.

In the display device according to the technique of the present disclosure, the dam wall includes: a first resin wall layer made of a resin material; a first conductive wall layer made of a conductive material and provided to cover the first resin wall layer; a second resin wall layer made of a resin material and provided over the first resin wall layer through the first conductive wall layer; and a second conductive wall layer made of a conductive material and provided to cover the second resin wall layer. The second resin wall layer is positioned between: a step portion included in the first conductive wall layer and covering a peripheral end face of the first resin wall layer; and a portion included in the second conductive wall layer and corresponding to the step portion of the first conductive wall layer.

Advantageous Effects

As to the display device according to a technique of the present disclosure, the dam wall includes: the first conductive wall layer provided to cover the first resin wall layer; and the second conductive wall layer provided to cover the second resin wall layer. Hence, the dam wall can increase in mechanical strength. Moreover, the step portion included in the first conductive wall layer and covering the peripheral end face of the first resin wall layer and the portion included in the second conductive wall layer and corresponding to the step portion of the first conductive wall layer are spaced apart from each other across the second resin wall layer. Such a feature can reduce delamination of the first conductive wall layer and the second conductive wall layer from each other caused by thermal processing to be carried out after the formation of the conductive wall layers. Hence, the yield in manufacturing display devices can improve.

BRIEF DESCRIPTION OF DRAWINGS

FIG. 20 is a cross-sectional view of the organic EL display device, taken from line XX-XX in FIG. 19.

DESCRIPTION OF EMBODIMENTS

Figure 1:
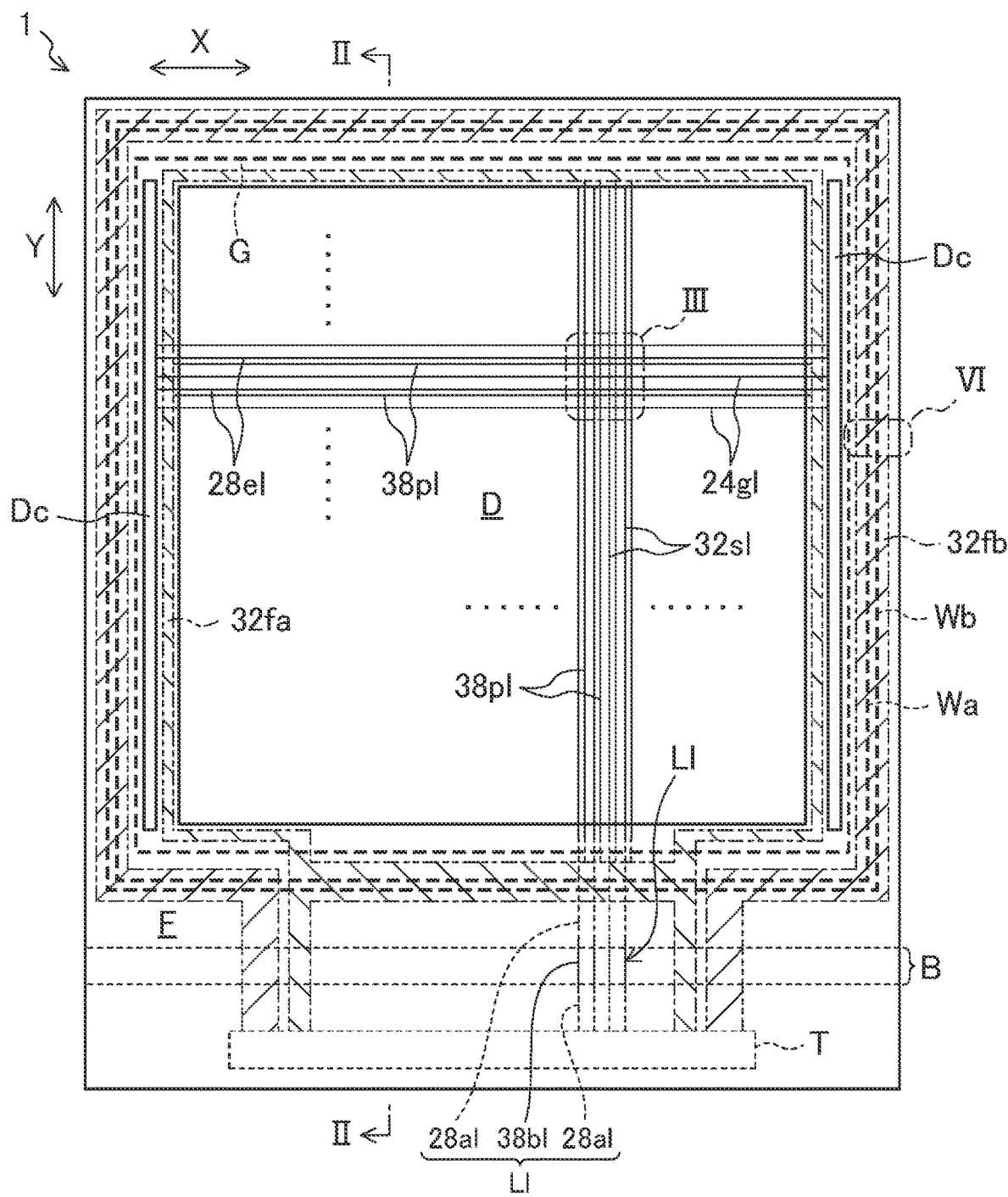
FIG. 1 is a plan view of a schematic configuration of an organic EL display device according to a first embodiment.

From now on, exemplary embodiments will be described in detail, with reference to the drawings. In the embodiments below, as a display device according to a technique of the present disclosure, an organic EL display device including an organic EL element will be described as an example.

Note that, in the embodiments below, a statement may be found as follows: on a constituent feature such as a film, layer, or element, another constituent feature such as another film, layer, or element is provided or formed. Such a statement does not mean that the other constituent feature is found only directly on the constituent feature. The statement also includes a case where, between both of those constituent features, still another constituent feature such as still another film, layer, or element is included.

Moreover, in the embodiments below, a statement may be found as follows: a constituent feature such as a film, layer, or element is connected to another constituent feature such as another film, layer, or element. Such a statement means that these constituent features are electrically connected together unless otherwise noted. Unless otherwise departing from the technical scope of the present disclosure, the description includes not only a case where the connection means direct connection, but also a case where the connection means indirect connection through still another constituent feature such as still another film, layer, or element. The description includes a case where a constituent feature is integral with another constituent feature; that is, the constituent feature is partially included in the other constituent feature.

Moreover, in the embodiments below, a statement may be found as follows: a constituent feature such as a film, layer, or element is in the same layer as another constituent feature such as another film, layer, or element. Such a statement means that the constituent feature is formed in the same process as the other constituent feature is. A statement may be found as follows: a constituent feature such as a film, layer, or element is below another constituent feature such as another film, layer, or element. Such a statement means that the constituent feature is formed in a process prior to a process of the other constituent feature. A statement may be found as follows: a constituent feature such as a film, layer, or element is above another constituent feature such as another film, layer, or element. Such a statement means that the constituent feature is formed in a process following a process of the other constituent feature.

Furthermore, in the embodiments below, a statement may be found as follows: a constituent feature such as a film, layer, or element is equivalent to, or the same as, another constituent feature such as another film, layer, or element. Such a statement not only means that the constituent feature is completely equivalent to, or the same as, the other constituent feature. The statement also includes a case where these constituent features are substantially equivalent or the same, such that the constituent feature and the other constituent feature vary within tolerances such as manufacturing tolerance.

In addition, in the embodiments below, the terms "first", "second", and "third" are used to distinguish the words and phrases to which the terms are assigned, and shall not limit the number, or some sort of order, of the words and phrases.

First Embodiment

Figure 2:
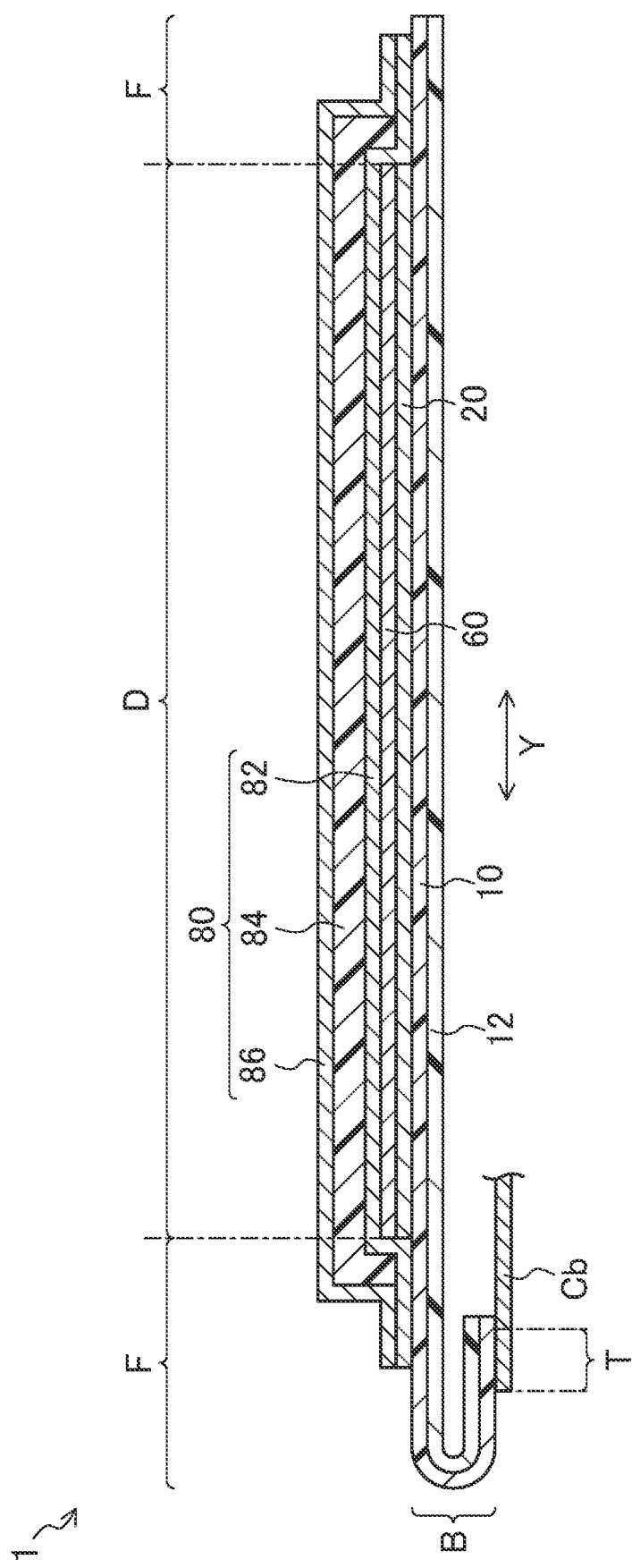
FIG. 2 is a cross-sectional view of the organic EL display device, taken from line II-II in FIG. 1.
Figure 3:
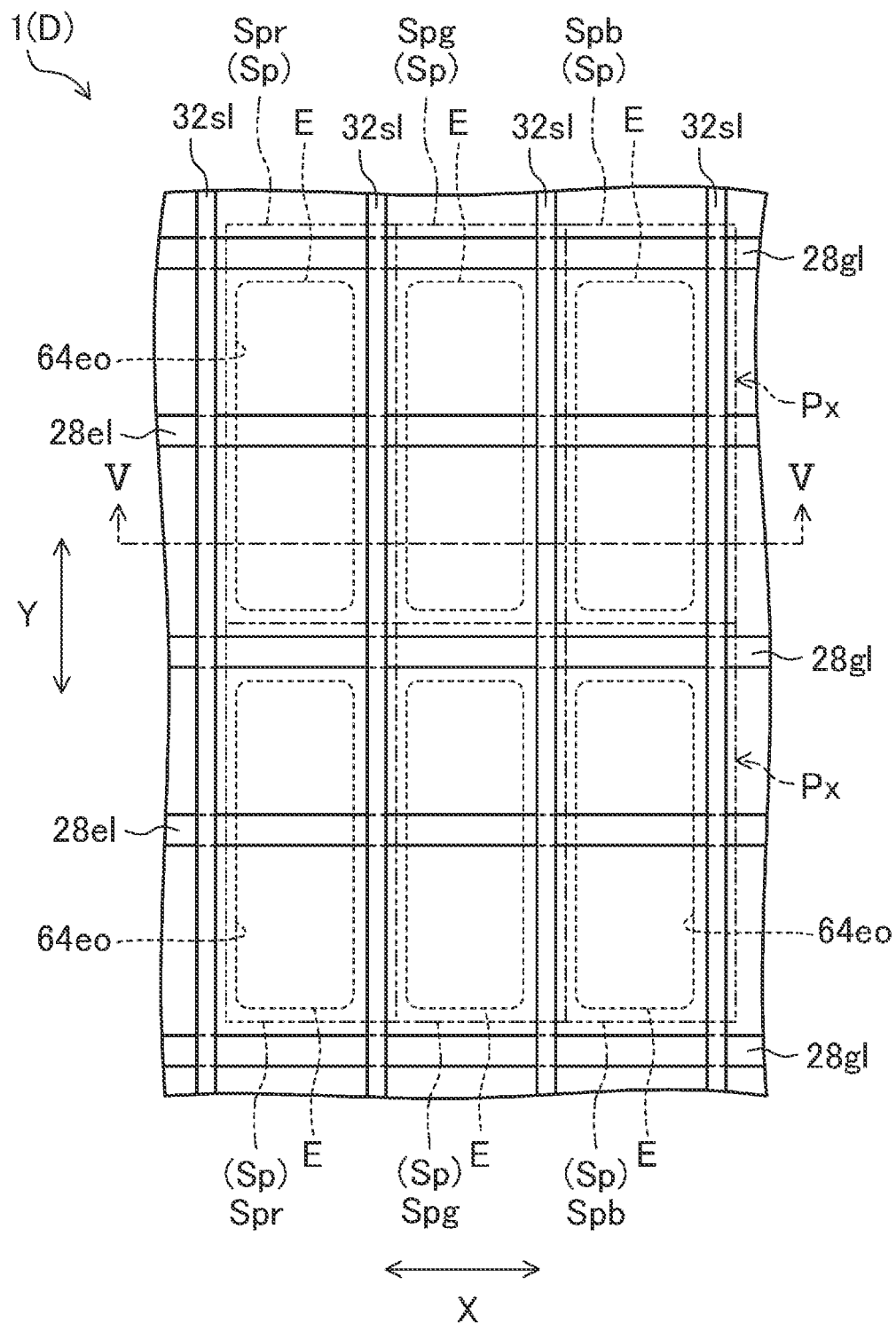
FIG. 3 is a plan view of pixels and each of the display wires in a first conductive layer and a second conductive layer included in the display region of the organic EL display device according to the first embodiment.
Figure 4:
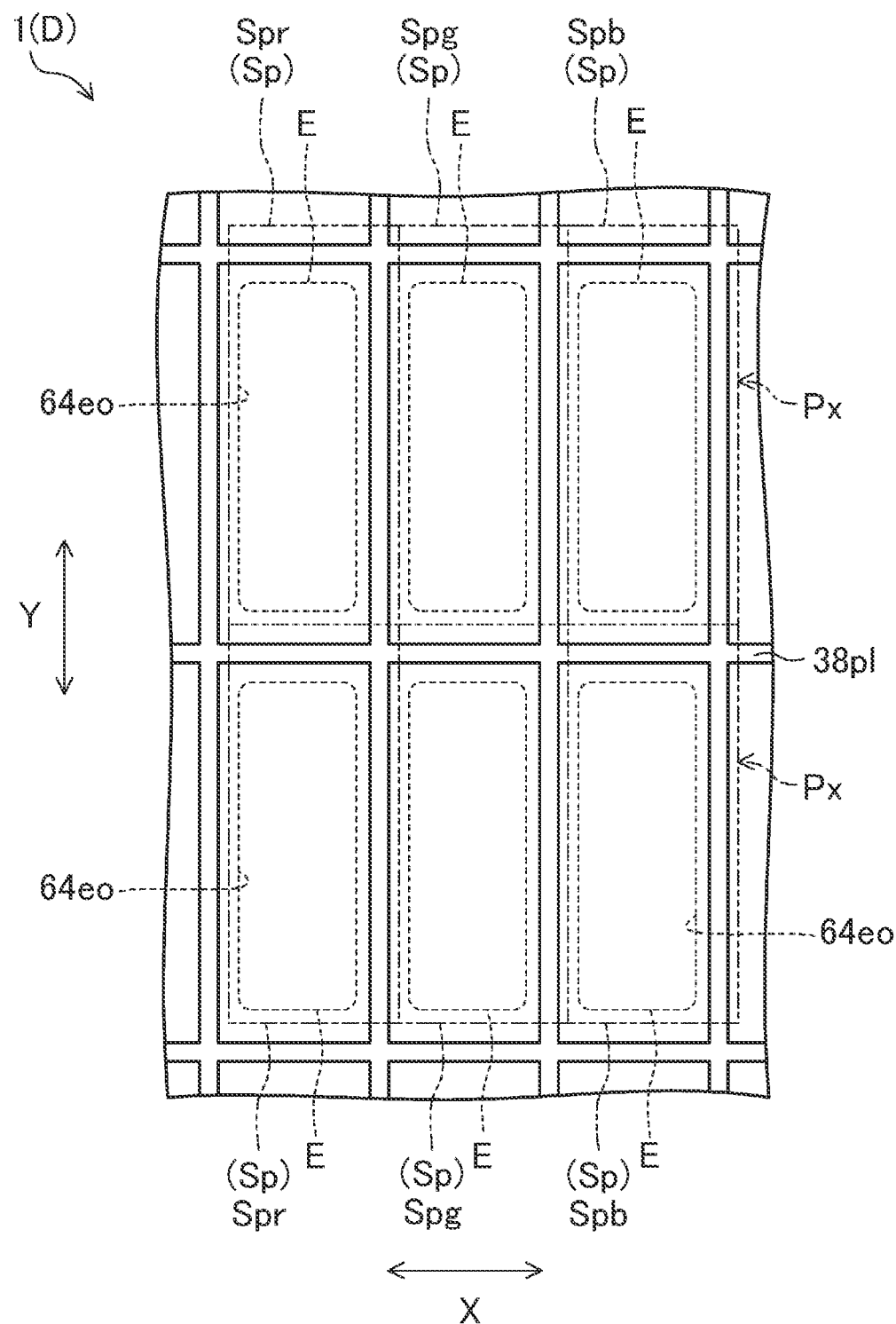
FIG. 4 is a plan view of pixels and display wires in a third conductive layer included in the display region of the organic EL display device according to the first embodiment.

FIG. 1 is a plan view of a schematic configuration of an organic EL display device 1 according to this first embodiment. FIG. 2 is a cross-sectional view of the organic EL display device 1, taken from line II-II in FIG. 1. FIG. 3 is a plan view of pixels Px and each of the display wires in a first conductive layer 28 and a second conductive layer 32 included in the display region D of the organic EL display device 1 according to this first embodiment. FIG. 4 is a plan view of pixels Px and display wires in a third conductive layer 38 included in the display region D of the organic EL display device 1 according to this first embodiment.

—Configuration of Organic EL Display Device—

As illustrated in FIGS. 1 and 2, the organic EL display device 1 includes: the display region D that displays an image; and a frame region F provided around the display region D.

The display region D is a rectangular region as a screen. In this embodiment, the display region D is, for example, rectangular. The display region D may also be substantially rectangular such as having arc-like sides, rounded corners, or partially notched sides. As illustrated in FIGS. 3 and 4, the display region D includes a plurality of the pixels Px.

The plurality of pixels Px are arranged in a matrix. Each of the pixels Px includes three sub-pixels Sp. The three sub-pixels Sp include: a sub-pixel Spr including a light-emitting region E emitting a red light; a sub-pixel Spg including a light-emitting region E emitting a green light; and a sub-pixel Spb including a light-emitting region E emitting a blue light. These three sub-pixels Spr, Spg, and Spb are arranged in, for example, a stripe.

As illustrated in FIGS. 1 and 2, the frame region F is a region shaped into a rectangular frame as a non-display portion other than the screen. The frame region F has one side portion provided with a terminal unit T to connect to an external circuit. In the frame region F between the display region D and the terminal unit T, a folding portion B is provided. The folding portion B is foldable around a folding axis; namely, a first direction X that is a horizontal direction in FIG. 1.

The terminal unit T is disposed to the back face of the organic EL display device 1 when the frame region F is folded at the folding portion B at an angle of 180° (in a U-shape). The terminal unit T is connected to a wiring board Cb such as a flexible printed circuit (FPC). The frame region F is provided with a plurality of lead wires L1 lead from the display region D to the terminal unit T. The terminal unit T is provided with terminals for the respective lead wires L1. Each of the plurality of lead wires L1 is connected to a display control circuit (not-shown) through the wiring board Cb at the terminal unit T.

In the frame region F, a trench G is provided to a first planarization film 36*pf* and a second planarization film 40*pf* to be described later. The trench G is shaped into a frame to surround the display region D. The trench G may also be shaped into a substantial C-shape to open toward the terminal T in planar view. The trench G penetrates the first planarization film 36*pf* and the second planarization film 40*pf*, and separates the first planarization film 36*pf* and the second planarization film 40*pf* inwards and outwards of the frame region F (see FIG. 7). The trench G plays a role of preventing water from infiltrating into the display region D.

In the frame region F, a drive circuit Dc including a gate driver and an emission driver is monolithically provided to a portion of a side (each of the right and left sides in FIG. 1) adjacent to a side provided with the terminal unit T. The drive circuit Dc is disposed closer to the display region D than the trench G is. The drive circuit Dc or a portion (the gate driver or the emission driver) of the drive circuit Dc may also be disposed closer to an outer periphery of the frame region F than the trench G is.

The frame region F includes a first frame wire 32*fa* (diagonally hatched toward upper left in FIG. 1) and a second frame wire 32*fb* (diagonally hatched toward upper right in FIG. 1). Each of the first frame wire 32*fa* and the second frame wire 32*fb* is an example of a frame wire.

The first frame wire 32*fa* is shaped into a frame, and provided closer to the display region D than the trench G and the drive circuit Dc are. The first frame wire 32*fa* passes under the trench G below the first planarization film 36*pf*, and extends to the terminal unit T. The first frame wire 32*fa* is supplied with a high-level power supply voltage (ELVDD) through the wiring board Cb at the terminal unit T. The second frame wire 32*fb* is shaped into a substantial C-shape, and provided closer to an outer periphery of the frame region F than the trench G and the drive circuit Dc are. The second frame wire 32*fb* has opposing ends extending along the first frame wire 32*fa* to the terminal unit T. The second frame wire 32*fb* is supplied with a low-level power supply voltage (ELVSS) through the wiring board Cb at the terminal unit T.

The frame region F includes a first dam wall Wa and a second dam wall Wb. The first dam wall Wa is shaped into a frame, and provided to an outer periphery of the trench G. The second dam wall Wb is shaped into a frame, and provided to an outer periphery of the first dam wall Wa. The first dam wall Wa and the second dam wall Wb are arranged to overlap the second frame wire 32*fb* in plan view. In the manufacturing process of the organic EL display device 1, an organic material is applied to form an organic layer 84 to be included in the sealing film 80. In the application of the organic material, the first dam wall Wa and the second dam wall Wb play a role of keeping the organic material from spreading out of the frame region F.

Figure 5:
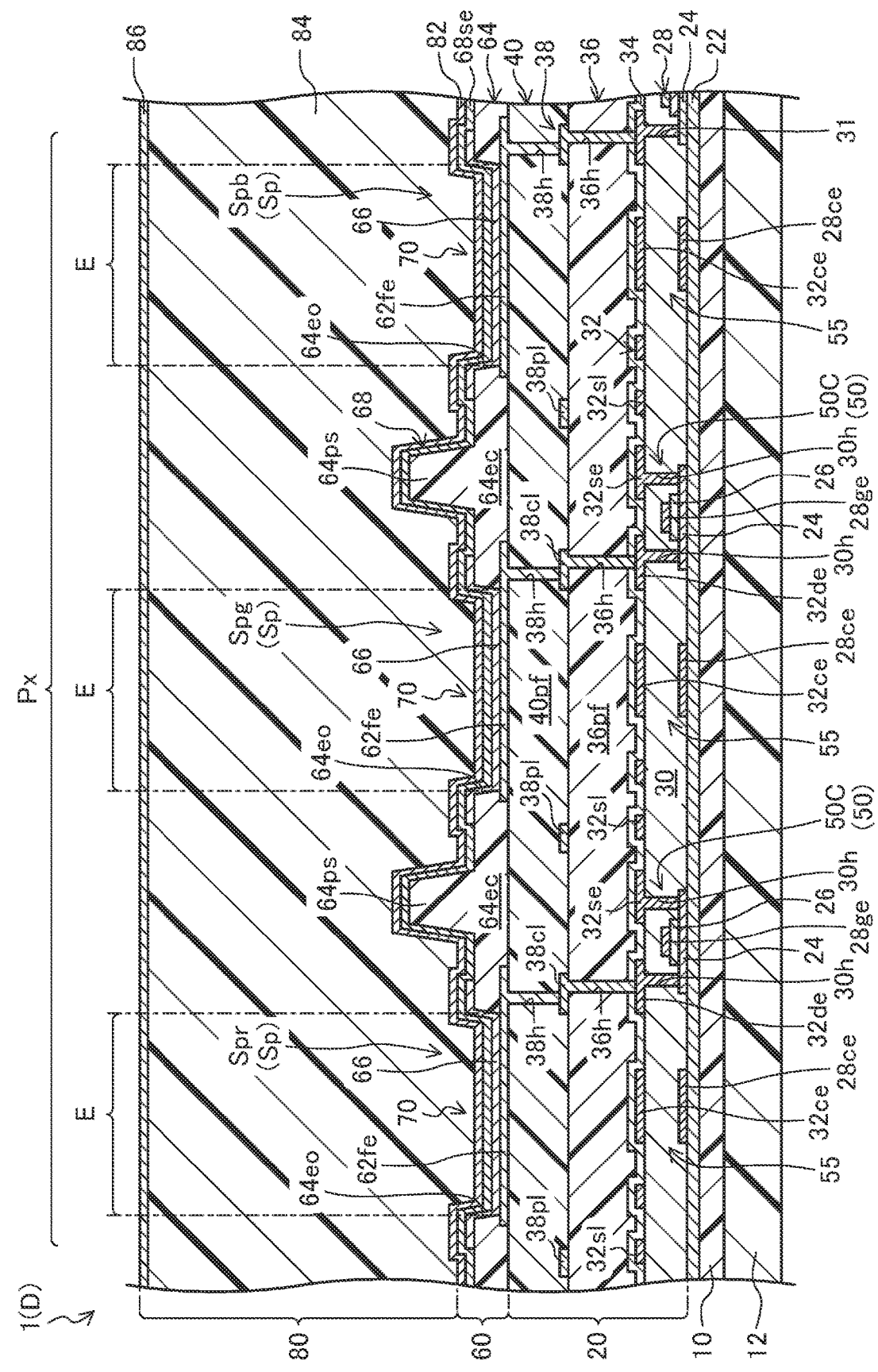
FIG. 5 is a cross-sectional view of the organic EL display device, taken from line V-V in FIG. 3.
Figure 6:
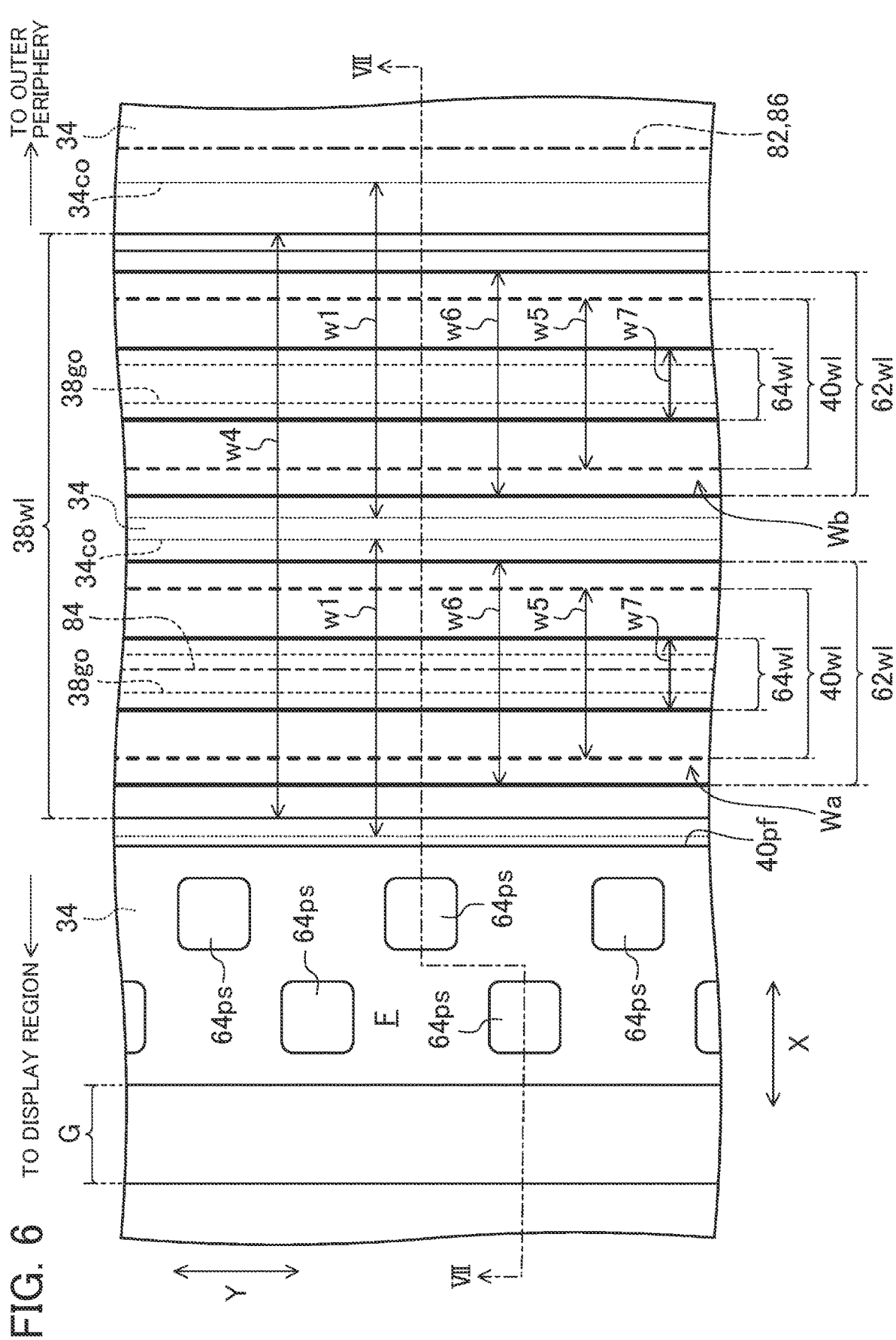
FIG. 6 is a plan view of a portion in a box VI of FIG. 1.
Figure 7:
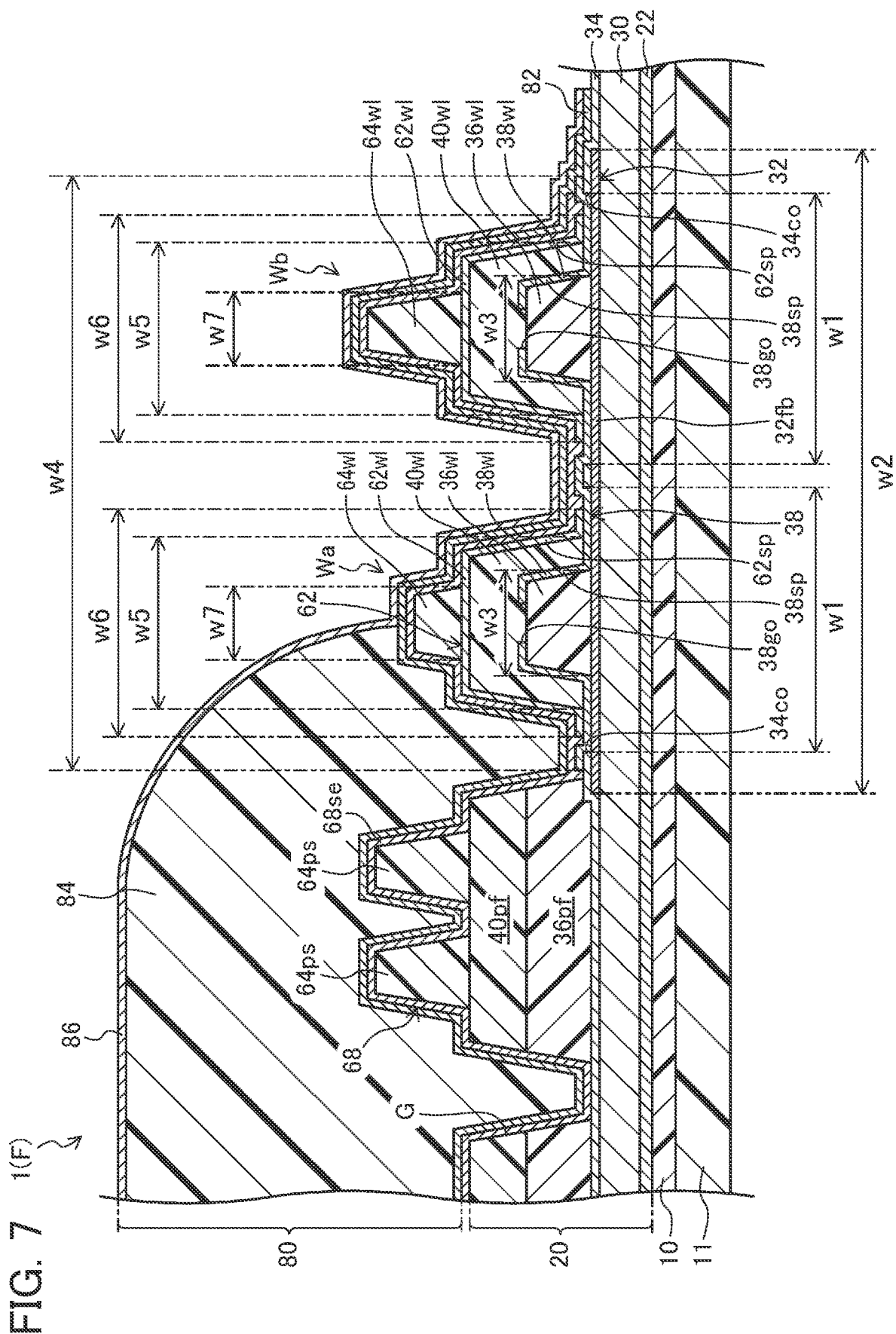
FIG. 7 is a cross-sectional view of the organic EL display device, taken from line VII-VII in FIG. 6.

FIG. 5 is a cross-sectional view of the organic EL display device 1, taken from line V-V in FIG. 3. FIG. 6 is a plan view of a portion in a box VI of FIG. 1. FIG. 7 is a cross-sectional view of the organic EL display device 1, taken from line VII-VII in FIG. 6.

The organic EL display device 1 employs active-matrix driving to cause TFTs 50 to individually control lights emitted from the sub-pixels Sp, and to display an image by the operations of the TFTs 50. As illustrated in FIGS. 2 and 5, the organic EL display device 1 includes: a resin substrate layer 10; a TFT layer 20 provided on the resin substrate layer 10; a light-emitting-element layer 60 provided on the TFT layer 20; and a sealing film 80 provided on the light-emitting-element layer 60.

Resin Substrate Layer

The resin substrate layer 10 is an example of a substrate layer as a base. The resin substrate layer 10 is formed of such a resin material as polyimide resin, polyamide resin, or epoxy resin. The resin substrate layer 10 is flexible. The resin substrate layer 10 may be a multilayer film including: an inorganic insulating layer made of such an inorganic material as silicon oxide, silicon nitride, or silicon oxide nitride; and a resin layer made of the above organic material. To a back face of the resin substrate layer 10, a protective film 12 is attached.

TFT Layer

The TFT layer 20 includes a plurality of the TFTs 50. The TFT layer 20 includes: a base coat film 22; a semiconductor layer 24; a gate insulating film 26; a first conductive layer 28; an interlayer insulating film 30; a second conductive layer 32; a protective film 34; a first resin layer 36; a third conductive layer 38; and a second resin layer 40, all of which are provided above the resin substrate layer 10 in the stated order.

The base coat film 22 is provided over the substantially entire surface of the resin substrate layer 10. The base coat film 22 is made of such an inorganic material as silicon oxide, silicon nitride, or silicon oxide nitride. The base coat film 22 is either a monolayer or multilayer inorganic insulating layer.

The semiconductor layer 24 is above the base coat film 22. The semiconductor layer 24 includes a plurality of semiconductor layers 24 each shaped into an island and provided on the base coat film 22. The semiconductor layer 24 is formed of an oxide semiconductor such as, for example, indium-gallium-zinc oxide (In—Ga—Zn—O based).

The gate insulating film 26 is above the semiconductor layer 24. The gate insulating film 26 is shaped into a plurality of islands provided on the respective semiconductor layers 24. The gate insulating film 26 is made of such an inorganic material as silicon oxide, silicon nitride, or silicon oxide nitride. The gate insulating film 26 is either a monolayer or multilayer inorganic insulating layer. The gate insulating film 26 may be continuously provided over the substantially entire surface of the base coat film 22, to cover the semiconductor layer 24.

The first conductive layer 28 is above the gate insulating film 26. The first conductive layer 28 is provided above the base coat film 22 and the gate insulating film 26. The first conductive layer 28 includes: a plurality of gate wires 28gl; a plurality of emission control wires 28el; a plurality of first portion wires 28al; a plurality of gate electrodes 28ge; and a plurality of first capacitive electrodes 28ce (also see FIGS. 1 and 3). The plurality of gate wires 28gl, the plurality of emission control wires 28el, the plurality of first portion wires 28al, the plurality of gate electrodes 28ge, and the plurality of first capacitive electrodes 28ce are formed of the same material and in the same layer.

For example, the plurality of gate wires 28gl, the plurality of emission control wires 28el, the plurality of first portion wires 28al, the plurality of gate electrodes 28ge, and the plurality of first capacitive electrodes 28ce are made of such a conductive material as aluminum (Al), tungsten (W), molybdenum (Mo), tantalum (Ta), chromium (Cr), titanium (Ti), or copper (Cu). The plurality of gate wires 28gl, the plurality of emission control wires 28el, the plurality of first portion wires 28al, the plurality of gate electrodes 28ge, and the plurality of first capacitive electrodes 28ce are either metal monolayer films or metal multilayer films.

The interlayer insulating film 30 is above the first conductive layer 28. The interlayer insulating film 30 is provided to cover the gate wires 28gl, the emission control wires 28el, the first portion wires 28al, the gate electrodes 28ge, and the first capacitive electrodes 28ce. The interlayer insulating film 30 is made of such an inorganic material as silicon oxide, silicon nitride, or silicon oxide nitride. The interlayer insulating film 30 is either a monolayer or multilayer inorganic insulating layer.

The second conductive layer 32 is above the interlayer insulating film 30. The second conductive layer 32 is provided on the interlayer insulating film 30. The second conductive layer 32 includes: a plurality of source wires 32sl; the first frame wire 32fa; the second frame wire 32fb; a plurality of source electrodes 32se; a plurality of drain electrodes 32de; and a plurality of second capacitive electrodes 32ce (also see FIGS. 1 and 3). The plurality of source wires 32sl, the first frame wire 32fa, the second frame wire 32fb, the plurality of source electrodes 32se, the plurality of drain electrodes 32de, and the plurality of second capacitive electrodes 32ce are formed of the same material and in the same layer.

For example, the plurality of source wires 32sl, the first frame wire 32fa, the second frame wire 32fb, the plurality of source electrodes 32se; the plurality of drain electrodes 32de, and the plurality of second capacitive electrodes 32ce are made of such a conductive material as aluminum (Al), tungsten (W), molybdenum (Mo), tantalum (Ta), chromium (Cr), titanium (Ti), or copper (Cu). The plurality of source wires 32sl, the first frame wire 32fa, the second frame wire 32fb, the plurality of source electrodes 32se, the plurality of drain electrodes 32de, and the plurality of second capacitive electrodes 32ce are either metal monolayer films or metal multilayer films.

The protective film 34 is above the second conductive layer 32. The protective film 34 is provided to cover the source wires 32sl, the first frame wire 32fa, the second frame wire 32fb, the source electrodes 32se, the drain electrodes 32de, and the second capacitive electrodes 32ce. That is, the protective film 34 is provided to cover the plurality of TFTs 50. The protective film 34 is made of such an inorganic material as silicon oxide, silicon nitride, or silicon oxide nitride. The protective film 34 is either a monolayer or multilayer inorganic insulating layer.

The first resin layer 36 is above the protective film 34. The first resin layer 36 includes: the first planarization film 36pf; and a first resin wall layer 36wl (see FIG. 7). The first planarization film 36pf is provided between the display region D and an inner periphery of the frame region F to cover the protective film 34. The first resin wall layer 36wl is provided to the frame region F. The first resin wall layer 36wl is included in the first dam wall Wa and the second dam wall Wb. The first planarization film 36pf and each first resin wall layer 36wl are formed of the same material and in the same layer. For example, the first planarization film 36pf and each first resin wall layer 36wl are made of such a resin material as polyimide resin.

The third resin layer 38 is above the first resin layer 36. The third conductive layer 38 includes: a power supply wire 38pl; a plurality of second portion wires 38bl; a plurality of relay conductive layers 38cl; and a first conductive wall layer 38wl (see FIG. 7). The first conductive wall layer 38wl is provided to the frame region F. The first conductive wall layer 38wl is included in the first dam wall Wa and the second dam wall Wb. The power supply wire 38pl, the plurality of second portion wires 38bl, the plurality of relay conductive layers 38cl, and the first conductive wall layer 38wl are formed of the same material and in the same layer.

For example, the power supply wire 38pl, the plurality of second portion wires 38bl, the plurality of relay conductive layers 38cl, and the first conductive wall layer 38wl are made of such a conductive material as aluminum (Al), tungsten (W), molybdenum (Mo), tantalum (Ta), chromium (Cr), titanium (Ti), or copper (Cu). The power supply wire 38pl, the plurality of second portion wires 38bl, the plurality of relay conductive layers 38cl, and the first conductive wall layer 38wl are either metal monolayer films or metal multilayer films.

The second resin layer 40 is above the third resin layer 38. The second resin layer 40 includes: the second planarization film 40pf; and a second resin wall layer 40wl (see FIG. 7). The second planarization film 40pf is provided between the display region D and the inner periphery of the frame region F to cover the power supply wire 38pl and the plurality of relay conductive layers 38cl. The first resin wall layer 40wl is provided to the frame region F. The second resin wall layer 40wl is included in the first dam wall Wa and the second dam wall Wb. The second planarization film 40pf and the second resin wall layer 40wl are formed of the same material and in the same layer. For example, the second planarization film 40pf and the second resin wall layer 40wl are made of such a resin material as polyimide resin.

Various Kinds of Wires and Conductive Layer

As illustrated in FIG. 3, the plurality of gate wires 28gl in the display region D extend in parallel with one another in the first direction X. The gate wires 28gl are display wires to transmit gate signals, and each provided to a corresponding one of the rows of the sub-pixels Sp. Each of the gate wires 28gl is connected to a gate driver of the drive circuit Dc. Each gate wire 28gl is selected and activated by the gate driver in accordance with a predetermined timing.

The plurality of emission control wires 28el in the display region D extend in parallel with one another in the first direction X. The emission control wires 28el are display wires to transmit emission control signals, and each provided to a corresponding one of the rows of the sub-pixels Sp. Each of the emission control wires 28el is connected to an emission driver of the drive circuit Dc. Each of the emission control wires 28el is sequentially selected and inactivated by the emission driver in accordance with a predetermined timing.

The plurality of source wires 32sl in the display region D extend in parallel with one another in a second direction Y (a vertical direction in FIG. 1) perpendicular to the first direction X. The source wires 32sl are display wires to transmit source signals, and each provided to a corresponding one of the columns of the sub-pixels Sp. Each of the source wires 32sl is connected to a lead wire L1. Each of the source wires 32sl is connected to the display control circuit through a lead wire L1 and the terminal unit T.

As illustrated in FIG. 1, the plurality of first portion wires 28al are provided: between the display region D and the folding portion B in the frame region F; and between the folding portion B and the terminal unit T in the frame region F. Both of the first portion wires 28al extend in parallel with one another in the second direction Y. Each of the first portion wires 28al is positioned closer to the display region D than the folding portion B is, and connected to a corresponding one of the source wires through a contact hole formed in the interlayer insulating film 30. Each of the first portion wires 28al is a portion of a lead wire L1.

The plurality of second portion wires 38b1 in frame region F extend in parallel with one another in the second direction Y across the folding portion B. Each of the second portion wires 38b1 is connected, through a contact hole formed in the interlayer insulating film 30 and the protective film 34, to a first portion wire 28al positioned closer to the display region D than the folding portion B is, and to a first portion wire 28al positioned closer to the terminal unit T than the folding portion B is. Each of the second portion wires 38bl connects together the first portion wires 28al provided across the folding portion B from each other, and constitutes a lead wire L1 together with the first portion wires 28al.

As illustrated in FIG. 4, the power supply wire 38pl in the display region D is provided on the first planarization film 36pf. The power supply wire 38pl is formed in a grid pattern to extend in each of the first direction X and the second direction Y. The power supply wire 38pl is a display wire to apply a predetermined voltage (a high-level power supply voltage). The power supply wire 38pl forms a grid of spaces each corresponding to one of the sub-pixels Sp, and extends between light-emitting regions E of the neighboring sub-pixels Sp. The power supply wire 38pl is connected to the first frame wire 32fa through a contact hole formed in the first planarization film 36pf and the protective film 34.

As illustrated in FIG. 5, the plurality of relay conductive layers 38cl in the display region D are provided on the first planarization film 36pf. Each of the relay conductive layers 38cl is shaped into an island for the respective sub-pixel Sp, and connected to the drain electrode 32de of a third TFT 50C through a contact hole 36h formed in the first planarization film 36pf. To each relay conductive layer 38cl, a first electrode 62fe is connected through a contact hole 40h formed in the second planarization film 40pf. Hence, the relay conductive layers 38cl relay connection between the drain electrodes 32de of the third TFTs 50C and the first electrodes 62fe.

Various Kinds of Electrodes

The plurality of gate electrodes 28ge, source electrodes 32se, and drain electrodes 32de are provided for each of the sub-pixels Sp. The gate electrodes 28ge, the source electrodes 32se, and the drain electrodes 32de are included in the TFTs 50. At least one first capacitive electrode 28ce and at least one second capacitive electrode 32ce are provided to each of the sub-pixels Sp. The first capacitive electrode 28ce and the second capacitive electrode 32ce are included in a capacitor 55.

TFT

The plurality of TFTs 50 are provided for each of the sub-pixels Sp. Any of the plurality of TFTs 50 is a top-gate TFT. Each of the TFTs 50 includes: the semiconductor layer 24; the gate insulating film 26; the gate electrode 28ge; the interlayer insulating film 30; the source electrode 32se; and the drain electrode 32de. The source electrode 32se and the drain electrode 32de are spaced apart from each other. The source electrode 32se and the drain electrode 32de are positioned to face each other across a region included in the semiconductor layer 24 and overlapping the gate electrode 28ge, and connected to different portions (a source region and a drain region) of the semiconductor layer 24 through contact holes 30h formed in the interlayer insulating film 30.

Capacitor

At least one capacitor 55 is provided for each of the sub-pixels Sp. The capacitor 55 is an element to hold data. The capacitor 55 includes: the first capacitive electrode 28ce; the interlayer insulating film 30; and the second capacitive electrode 32ce. The first capacitive electrode 28ce and the second electrode 32ce overlap through the interlayer insulating film 30.

Light-Emitting-Element Layer

The light-emitting-element layer 60 includes a plurality of organic EL elements 70. The organic EL elements 70 are an example of light-emitting elements. The light-emitting-element layer 60 includes: a fourth conductive layer 62; a third resin layer 64; an organic EL layer 66; and a fifth conductive layer 68, all of which are provided above the second planarization film 40pf in the stated order.

The fourth conductive layer 62 includes: a plurality of the first electrodes 62fe; and two second conductive wall layers 62wl (see FIG. 7). The first electrodes 62fe are provided for the respective sub-pixels Sp (the respective organic EL elements 70). Each first electrode 62fe is connected, through the relay conductive layer 38cl, to the drain electrode 32de of the third TFT 50C in the corresponding sub-pixel Sp. The first electrodes 62fe function as anodes to inject holes into the organic EL layer 66. The first electrodes 62fe reflect light. The second conductive wall layers 62wl are provided to the frame region F. The second conductive wall layers 62wl are included in the first dam wall Wa and the second dam wall Wb.

The first electrodes 62fe and the second conductive wall layers 62wl are formed of the same material and in the same layer. Exemplary materials of the first electrodes 62fe and the second conductive wall layers 62wl include such metal materials as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn).

Moreover, the exemplary materials of the first electrodes 62fe and the second conductive wall layers 62wl may also include an alloy of astatine (At) and astatine dioxide (AtO$_2$). Furthermore, the first electrodes 62fe and the second conductive wall layers 62wl may also be formed of such conductive oxides as tin oxide (SnO), zinc oxide (ZnO), indium tin oxide (ITO) and indium zinc oxide (IZO). Preferably, the first electrodes 62fe and the second conductive wall layers 62wl are formed of a material having a high work function in order to improve efficiency in injecting the holes into the organic EL layer 66. The first electrodes 62fe and the second conductive wall layers 62wl may be multilayers including two or more layers made of the above materials.

The third resin layer 64 includes: an edge cover 64ec; a photo spacer 64ps; and a third resin wall layer 64wl (see FIG. 7). The edge cover 64ec separates the first electrodes 62fe of neighboring sub-pixels Sp. The edge cover 64ec is formed into a grid pattern on the whole, and covers an edge portion of each of the first electrodes 62fe. The edge cover 64ec has an opening 64eo for each of the organic EL elements 70 to expose the first electrode 62fe. The organic EL elements 70 emit light in regions corresponding to the openings 64eo of the edge cover 64ec. Of a sub-pixel Sp, the region corresponding to the opening 64eo of the edge cover 64ec is the light-emitting region E.

The edge cover 64ec has a surface partially protruding upwards to form a plurality of the photo spacers 64ps. As illustrated in FIG. 6, the plurality of photo spacers 64ps are provided also to the frame region F in a predetermined arrangement. The third resin wall layer 64wl is provided to the frame region F. The third resin wall layer 64wl is included in the first dam wall Wa and the second dam wall Wb.

Each of the third resin wall layer 64wl, the edge cover 64ec, and the photo spacers 64pc is formed in the same layer and of the same material. Exemplary materials of the edge cover 64ec, the photo spacers 64ps, and the third resin wall layer 64wl include such resin materials as polyimide resin, acrylic resin, polysiloxane resin, and novolak resin.

Organic EL Element Layer

The organic EL layer 66 is an example of a light-emitting functional layer. The organic EL layer 66 is provided on an individual first electrode 62fe in each opening 64eo of the edge cover 64ec.

Figure 8:
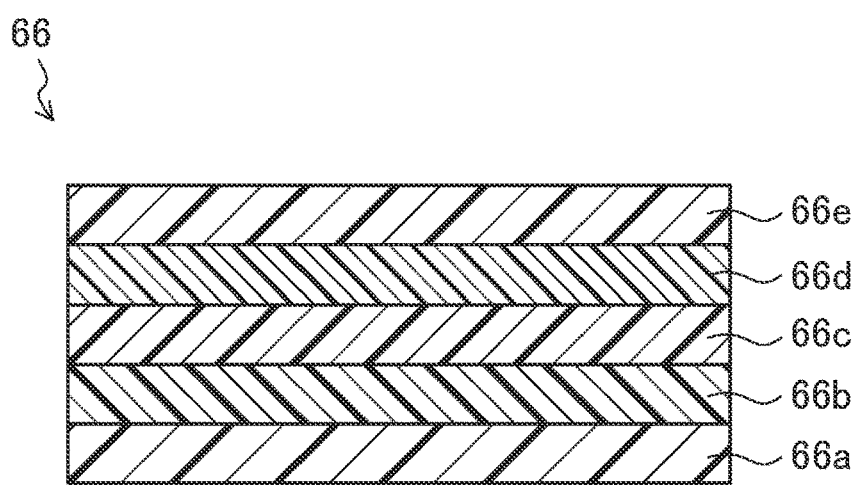
FIG. 8 is a cross-sectional view of a multilayer structure of an organic EL layer in the organic EL display device according to the first embodiment.

FIG. 8 is a cross-sectional view of a multilayer structure of the organic EL layer 66. As illustrated in FIG. 8, the organic EL layer 66 includes: a hole-injection layer 66a; a hole-transport layer 66b; a light-emitting layer 66c; an electron-transport layer 66d; and an electron-injection layer 66e, all of which are provided above the first electrode 62fe in the stated order. Some of the hole-injection layer 66a, the hole-transport layer 66b, the electron-transport layer 66d, and the electron-injection layer 66e may continuously be provided in common among the plurality of sub-pixels Sp.

The hole-injection layer 66a is also referred to as an anode buffer layer. The hole-injection layer 66a approximates the energy levels of the first electrode 62fe and the organic EL layer 66, and increases efficiency in injection of the holes from the first electrode 62fe to the organic EL layer 66. Exemplary materials of the hole-injection layer 66a include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole-transport layer 66b is capable of efficiently transporting the holes to the light-emitting layer 66c. Exemplary materials of the hole transport-layer 66b include porphyrin derivatives, aromatic tertiary amine compounds, styryl amine derivatives, polyvinylcarbazole, poly-p-phenylene vinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

When the first electrode 62fe and a second electrode 68se apply voltages, the light-emitting layer 66c allows the holes injected from the first electrode 62fe and the electrons injected from the second electrodes 68se to recombine together, and emits light. The light-emitting layer 66c is formed of a different material in accordance with a color (red, green, or blue) of light emitted from the organic EL element 70 of an individual sub-pixel Sp.

Exemplary materials of the light-emitting layer 66c include metal oxinoid compounds [8-hydroxyquinoline metal complexes], naphthalene derivatives, anthracene derivatives, diphenylethylene derivatives, vinylacetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rodamine derivatives, acridine derivatives, phenoxazone, quinacridone derivatives, rubrene, poly-p-phenylene vinylene, and polysilane.

The electron-transport layer 66d efficiently transports the electrons to the light-emitting layer 66c. Exemplary materials of the electron-transport layer 66d include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds.

The electron-injection layer 66e is also referred to as a cathode buffer layer. The electron-injection layer 66e is capable of approximating the energy levels of the second electrode 68se and the organic EL layer 66, and increasing efficiency in injection of the electrons from the second electrode 62se to the organic EL layer 66. Exemplary materials of the electron-injection layer 5 may include: such inorganic alkaline compounds as lithium fluoride (LiF), magnesium fluoride magnesium fluoride ($MgF_2$), calcium fluoride ($CaF_2$), strontium fluoride ($SrF_2$), and barium fluoride ($BaF_2$); aluminum oxide ($Al_2O_3$); and strontium oxide (SrO).

The fifth conductive layer 68 includes the second electrode 68se. The second electrode 68se is provided in common among the plurality of sub-pixels Sp. The second electrode 68se covers the organic EL layers 66 and the edge cover 64ec, and overlaps the first electrodes 62fe through the organic EL layers 66. The second electrode 68se extends to the frame region F, and covers both the first dam wall Wa and the second dam wall Wb. The second electrode 62se functions as a cathode to inject the electrons into the organic EL layers 66. The second electrode 68se is transparent to light.

Exemplary materials of the second electrode 68se include silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), and lithium fluoride (LiF).

Moreover, the second electrode 68se may also be formed of an alloy of magnesium (Mg)/copper (Cu), magnesium (Mg)/silver (Ag), sodium (Na)/potassium (K), astatine (At)/astatine dioxide ($AtO_2$), lithium (Li)/aluminum (Al), lithium (Li)/calcium (Ca)/aluminum (Al), or lithium fluoride (LiF)/calcium (Ca)/aluminum (Al).

Furthermore, the second electrode 68*se* may also be formed of such conductive oxides as tin oxide (SnO), zinc oxide (ZnO), indium tin oxide (ITO) and indium zinc oxide (IZO). Preferably, the second electrode 68*se* is made of a material having a low work function in order to improve efficiency in injection of the electrons into the organic EL layers 66. The second electrode 68*se* may be a multilayer including two or more layers made of the above materials.

Each of the first electrodes 62*fe*, each of the organic EL layers 66, and the second electrode 68*se* are included in an organic EL element 70. The organic EL elements 70 are top-emission organic EL elements. The organic EL elements 70 are provided for the respective sub-pixels Sp.

Pixel Circuit

Figure 9:
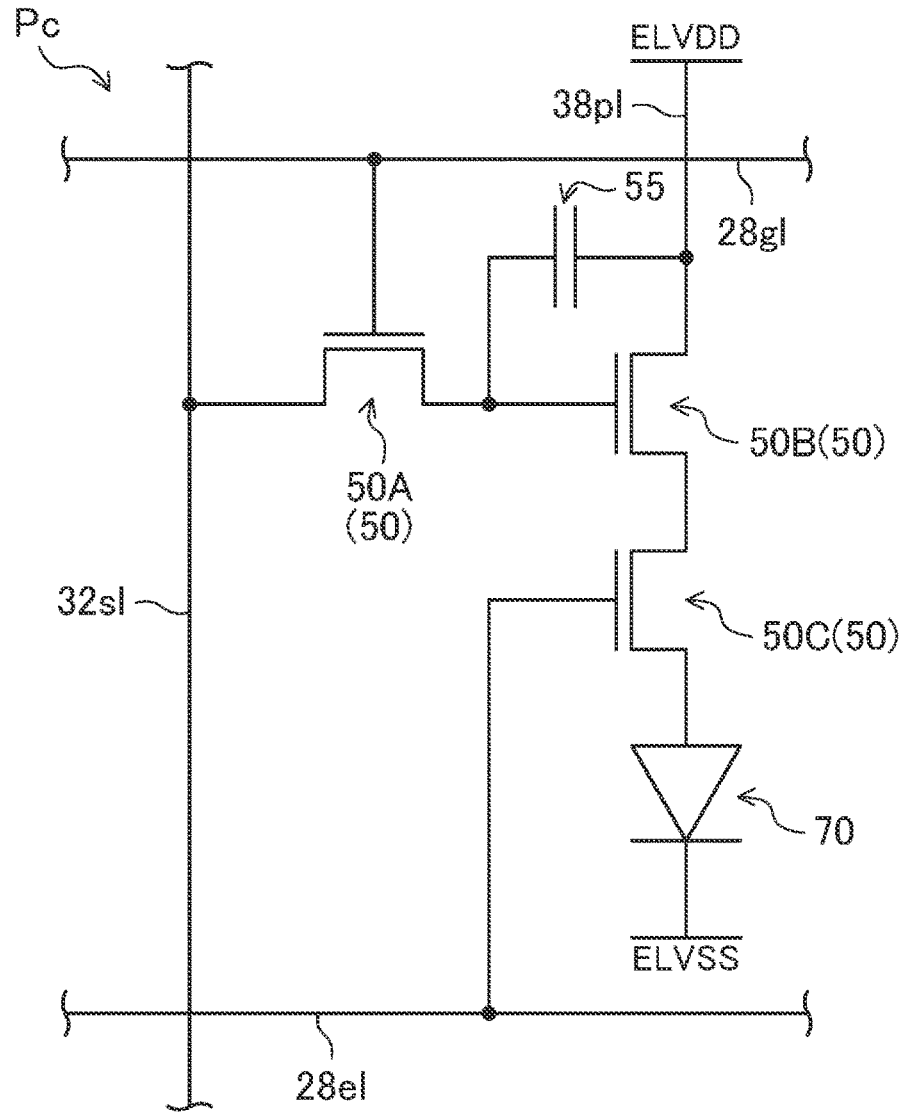
FIG. 9 is an equivalent circuit diagram illustrating a pixel circuit of the organic EL display device according to the first embodiment.

FIG. 9 is s an equivalent circuit diagram illustrating a pixel circuit Pc. The plurality of TFTs 50, the capacitor 55, and the organic EL element 70 provided for each of the sub-pixels Sp are included in the pixel circuit Pc illustrated in FIG. 9. The pixel circuit Pc controls light to be emitted from the organic EL element 70 in the light-emitting region E of the corresponding sub-pixel Sp, in accordance with a gate signal to be supplied to the gate wire 28*g*1, an emission signal to be supplied to the emission control wire 28*el*, a source signal to be supplied to the source wire 32*sl*, a high-level power supply voltage (ELVDD) to be supplied to the power source wire 38*pl*, and a low-level power source voltage (ELVSS) to be supplied to the second electrode 68*se*.

The plurality of TFTs 50 included in the pixel circuit Pc are a first TFT 50A, a second TFT 50B, and the third TFT 50C. The first TFT 50A in each sub-pixel Sp is connected to the corresponding gate wire 28*gl*, source wire 32*sl*, and second TFT 50B. The second TFT 50B in each sub-pixel Sp is connected to the corresponding first TFT 50A, power supply wire 38*pl*, and third TFT 50C. The third TFT 50C in each sub-pixel Sp is connected to the corresponding second TFT 50B, emission control wire 28*el*, and organic EL element 70. The capacitor 55 in each sub-pixel Sp is connected to the corresponding first TFT 50A, second TFT 50B, and power supply wire 38*pl*.

First Dam Wall and Second Dam Wall

As illustrated in FIG. 1, the first dam wall Wa and the second dam wall Wb are similar to each other, and spaced apart from each other in the transverse direction of the frame region F. As illustrated in FIG. 7, each of the first dam wall Wa and the second dam wall Wb is partially provided in a portion, of the frame region F, without the protective film 34. Each of the first dam wall Wa and the second dam wall Wb includes: the first resin wall layer 36*wl*; the first conductive wall layer 38*wl*; the second resin wall layer 40*wl*; the second conductive wall layer 62*wl*; and the third resin wall layer 64*wl*.

In the frame region F, the second frame wire 32*fb* is provided below each of the first resin wall layers 36*wl*. The protective film 34 includes, in the frame region F, connecting openings 34*co* each formed to correspond to one of the first dam wall Wa and the second dam wall Wb. The connecting openings 34*co* correspond to a third opening. The connecting openings 34*co* are separately provided to portions of the protective film 34 each corresponding to one of the first dam wall Wa and the second dam wall Wb. The connecting openings 34*co* may also be provided continuously to both of the portions of the protective film 34 corresponding to the first dam wall Wa and the second dam wall Wb. Each of the connecting openings 34*co* is a slit opening extending in a longitudinal direction of the corresponding first dam wall Wa or second dam wall Wb.

Each connecting opening 34*eo* is not formed in a portion of the frame region F provided with the first frame wire 32*fa*, but formed in a portion of the frame region F provided with the second frame wire 32*fb*. Each connecting opening 34*co* exposes, from the protective film 34, an upper face of the second frame wire 32*fb*. A width w1 of each connecting opening 34*co* is smaller than a width w2 of the second frame wire 32*fb*. The second frame wire 32*fb* is exposed from the protective film 34 across each of the connecting openings 34*co*. The width w1 of each connecting opening 34*eo* is greater than a width w3 of the first resin wall layer 36*wl* in either the corresponding first dam wall Wa or second dam wall Wb.

Each first resin wall layer 36*wl* is shaped into a frame, and provided to surround the display region D. In a portion of the frame region F where the first frame wire 32*fa* is provided, each first resin wall layer 36*wl* is provided on the protective film 34. In a portion of the frame region F where the second frame wire 32*fb* is provided, each first resin wall layer 36*wl* is provided on the second frame wire 32*fb* inside the corresponding connecting opening 34*ec*. The second frame wire 32*fb* is present, inside the connecting opening 34*co*, on both the inner periphery and the outer periphery of each first resin wall layer 36*wl*. The second frame wire 32*fb* may be present only on one of the inner periphery or the outer periphery of either first resin wall layer 36*wl*, or only on one of the inner periphery or the outer periphery of each of the first resin wall layers 36*wl*.

The first conductive wall layer 38*wl* is shaped into a frame and provided to surround the display region D. The first conductive wall layer 38*wl* continuously covers each of the first resin wall layers 36*wl*. The first conductive wall layer 38*wl* may be divided into two to individually cover each of the first resin wall layers 36*wl*. The first conductive wall layer 38*wl* includes a step portion 38*sp* to cover peripheral end faces toward the inner periphery and the outer periphery of the first resin wall layer 36*wl*. A width w4 of the first conductive wall layer 38*wl* is greater than the width w1 of the connecting opening 34*co*.

The first conductive wall layer 38*wl* covers the connecting opening 34*co* on the inner periphery and the outer periphery of the first resin wall layer 36*wl*, and covers an edge portion of the connecting opening 34*co* in the protective film 34. The first conductive wall layer 38*wl* is in contact with, and connected to, the second frame wire 32*fb* through the connecting opening 34*co* on both the inner periphery and the outer periphery of each first resin wall layer 36*wl*. The first conductive wall layer 38*wl* may cover the connecting opening 34*co* only on one of the inner periphery or the outer periphery of either first resin wall layer 36*wl*, or only on one of the inner periphery or the outer periphery of each of the first resin wall layers 36*wl*, and may connect to the second frame wire 32*fb*.

The first conductive wall layer 38*wl* includes a degassing opening 38*go* formed for each of the resin wall layers 36*wl*. The degassing opening 38*go* corresponds to a first opening. The degassing opening 38*go* is a slit opening extending in a longitudinal direction of the corresponding first dam wall Wa or second dam wall Wb. Each degassing opening 38*go* is shaped into a continuous frame. Each degassing opening 38*go* may be divided into a plurality of openings so that the divided openings form a frame as a whole.

Each degassing opening 38*go* partially exposes an upper face of the first resin wall layer 36*wl* from the first conductive wall layer 38*wl*. The first conductive wall layer 38*wl* allows the degassing opening 38*go* to expose a center portion of the upper face of the first resin wall layer 36*wl* in the transverse direction, and covers both side portions of the first resin wall layer 36wl in the transverse direction. Each second resin wall layer 40wl covers the degassing opening 38go formed in the first conductive wall layer 38wl of the corresponding first dam wall Wa or second dam wall Wb.

Each second resin wall layer 40wl is shaped into a frame and provided to surround the display region D. A width w5 of each second resin wall layer 40wl is greater than the width w3 of the corresponding first resin wall layer 36wl, and smaller than the width w1 of the connecting opening 34co. Each second resin wall layer 40wl covers all of the first resin wall layer 36wl in the transverse direction through the corresponding first conductive wall layer 38wl. Then, each second resin wall layer 40wl is positioned between the step portion 38sp of the first conductive wall layer 38wl and a step portion 62sp included in the second conductive wall layer 62wl and corresponding to the step portion 38sp of the first conductive wall layer 38wl.

Each second resin wall layer 40wl is provided inside the connecting opening 34co, in a portion of the frame region F where the second frame wire 32fb is provided. The first conductive wall layer 38wl is present, inside the connecting opening 34co, on both the inner periphery and the outer periphery of each second resin wall layer 40wl. The first conductive wall layer 38wl may be present only on one of the inner periphery or the outer periphery of either second resin wall layer 40wl, or only on one of the inner periphery or the outer periphery of each of the second resin wall layers 40wl.

The second conductive wall layer 62wl is shaped into a frame and provided to surround the display region D. The second conductive wall layer 62wl may be divided into two to individually cover each of the second resin wall layers 40wl. The second conductive wall layer 62wl may be provided to continuously cover each of the second resin wall layers 40wl. The second conductive wall layer 62wl includes the step portion 62sp to cover peripheral end faces toward the inner periphery and the outer periphery of the second resin wall layer 40wl. The step portion 62sp of the second conductive wall layer 62wl is positioned across the second resin wall layer 40wl from the step portion 38sp of the first conductive wall layer 38wl, and spaced apart from the first conductive wall layer 38wl. A width w6 of the second conductive wall layer 62wl is greater than the width w5 of the second resin wall layer 40wl.

The second conductive wall layer 62wl extends to the inner periphery and the outer periphery of the second resin wall layer 40wl. The second conductive wall layer 62wl is in contact with, and connected to, the first conductive wall layer 38wl positioned inside the connecting opening 34co, on both the inner periphery and the outer periphery of the second resin wall layer 40wl. The second conductive wall layer 62wl may be connected to the first conductive wall layer 38wl only on one of the inner periphery or the outer periphery of either second resin wall layer 40wl, or only on one of the inner periphery or the outer periphery of each of the second resin wall layers 40wl. Each second conductive wall layer 62wl is in contact with, and connected to, the second electrode 68se overlapping the second conductive wall layer 62wl.

The first conductive wall layer 38wl and each second conductive wall layer 62wl have portions positioned in the frame region F and facing across at least display region D from each other. The portions overlap in contact with each other. In this configuration example, the first conductive wall layer 38wl and each second conductive wall layer 62wl overlap in contact with each other all around the first dam wall Wa and the second dam wall Wb. The first conductive wall layer 38wl and each second conductive layer 62wl connect the second frame wire 32fb and the second electrode 68se together. The first conductive wall layer 38wl and each second conductive layer 62wl, as well as the second frame wire 32fb, constitute a power supply wire to apply a predetermined voltage (a low-level power supply voltage) to the second electrode 68se.

Each third resin wall layer 64wl is shaped into a frame and provided to surround the display region D. Each third resin wall layer 64wl overlaps the corresponding second resin wall layer 40wl through the second conductive wall layer 62wl. A width w7 of each third resin wall layer 64wl is smaller than the width w5 of the second resin wall layer 40wl. All of each third resin wall layer 64wl is present above the corresponding second resin wall layer 40wl through the second conductive wall layer 62wl. In this configuration example, the third resin wall layer 64wl of the first dam wall Wa is taller than the third resin wall layer 64wl of the second dam wall Wb. The third resin wall layer 64wl of the first dam wall Wa may be as tall as, or taller than, the third resin wall layer 64wl of the second dam wall Wb.

Sealing Film

The sealing film 80 is provided to cover the plurality of TFTs 70. The sealing film 80 protects the organic EL layer 66 of each of the organic EL elements 70 from, for example, water and oxygen. The sealing film 80 includes: a first inorganic layer 82, an organic layer 84; and a second inorganic layer 86, all of which are provided above the fifth conductive layer 68 in the stated order.

The first inorganic layer 82 covers the second electrode 68se as well as the first dam wall Wa and the second dam wall Wb. The organic layer 84 is provided behind the first dam wall Wa. The organic layer 84 may be present between the first dam wall Wa and the second dam wall Wb. The second inorganic layer 86 covers the organic layer 84, and extends to an outer periphery of the second dam wall Wb. Peripheral end portions of the first inorganic layer 82 and the second inorganic layer 86 are joined together toward the outer periphery with respect to the first dam wall Wa.

The organic layer 84 is covered with, and enclosed between, the first inorganic layer 82 and the second inorganic layer 86. For example, each of the first organic layer 82 and the second organic layer 86 is formed of such an inorganic insulating film as a silicon oxide film, a silicon nitride film, or a silicon oxide nitride film. Exemplary materials of the organic film 84 include such organic materials as acrylic resin, epoxy resin, silicone resin, polyuria resin, parylene resin, polyimide resin, and polyamide resin.

—Operation of Organic EL Display Device—

As to the organic EL display device 1 of the above configuration, in each of the sub-pixels Sp, first, the corresponding emission control wire 28el is selected and inactivated. The organic EL element 70 turns OFF the light. Then, the corresponding gate wire 28gl is selected and activated. Through the gate wire 28gl, a gate signal is input to the first TFT 50A. The first TFT 50A turns ON. When the first TFT 50A turns ON, a predetermined voltage, corresponding to a source signal to be transmitted through the source wire 32sl, is applied to the second TFT 50B and written in the capacitor 55.

Then, when the emission control wire 28el is deselected and inactivated, an emission signal is input through the emission control wire 28el to the third TFT 50C. The third TFT 50C turns ON. When the third TFT 50C turns ON, a current in accordance with a gate voltage of the second TFT 50B is supplied from the power supply wire 38p1 to the organic EL element 70. Hence, the light-emitting layer 66*c* of each of the organic EL layers 66 emits light, and an image is displayed. Note that, the organic EL layer 66 (the light-emitting layer 66*c*) continues to emit light for each of the sub-pixels Sp until a gate signal of the next frame is input. This is because, even if the first TFT 50A turns OFF, the gate voltage of the second TFT 50B is held in the capacitor 55.

—Method for Manufacturing Organic EL Display Device—

Figure 10:
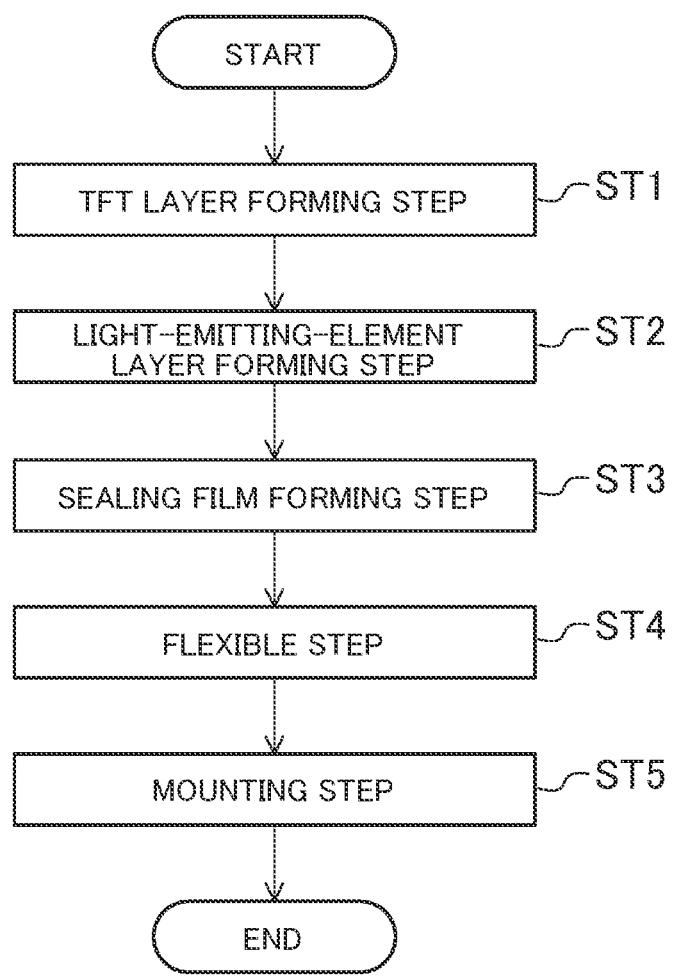
FIG. 10 is a flowchart schematically showing a method for manufacturing the organic EL display device according to the first embodiment.

A method for manufacturing the organic EL display device 1 of this embodiment will be described below. FIG. 10 is a flowchart schematically showing a method for manufacturing the organic EL display device 1.

As illustrated in FIG. 10, the method for manufacturing the organic EL display device 1 includes: a TFT layer forming step ST1; a light-emitting-element layer forming step ST2; a sealing film forming step ST3; a flexible step ST4; and a mounting step ST5.

TFT Layer Forming Step

Figure 11:
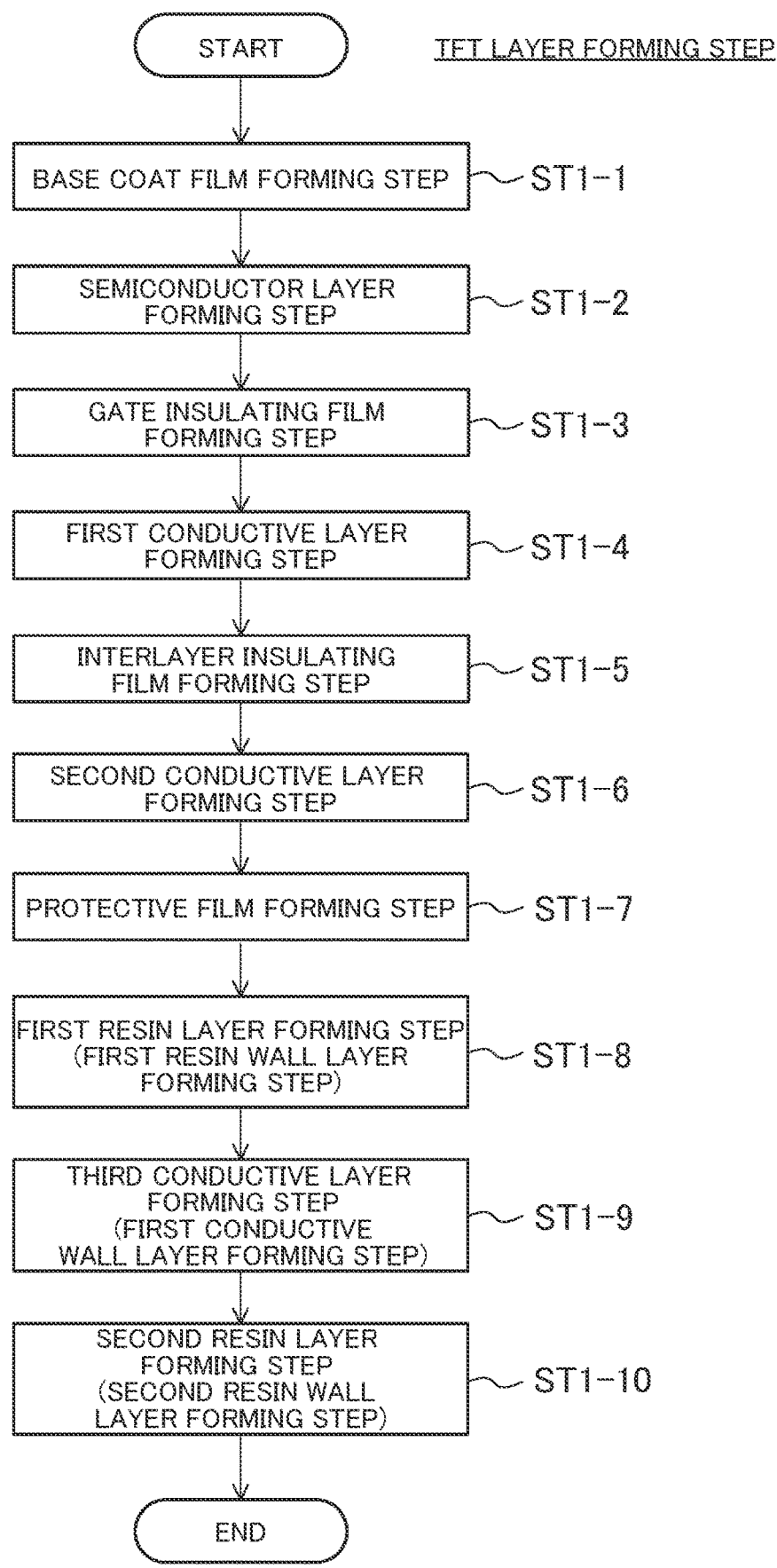
FIG. 11 is a flowchart schematically showing a TFT layer forming step in the method for manufacturing the organic EL display device according to the first embodiment.

FIG. 11 is a flowchart schematically showing the TFT layer forming step ST1. As illustrated in FIG. 11, the TFT layer forming step ST1 includes: a base coat film forming step ST1-1; a semiconductor layer forming step ST1-2; a gate insulating film forming step ST1-3; a first conductive layer forming step ST1-4; an interlayer insulating film forming step ST1-5; a second conductive layer forming step ST1-6; a protective film forming step ST1-7; a first resin layer forming step ST1-8; a third conductive layer forming step ST1-9; and a second resin layer forming step ST1-10.

At the TFT layer forming step ST1, first, a surface of a glass substrate 100 is, for example, coated with a resin material to form the resin substrate layer 10. Next, at the base coat film forming step ST1-1, on the resin substrate layer 10 formed on the surface of the glass substrate 100, a single-layer inorganic insulating film or a multilayer inorganic insulating film is deposited by, for example, chemical vapor deposition (CVD) to form the base coat film 22.

Next, at the semiconductor layer forming step ST1-2, on the substrate provided with the base coat film 22, a semiconductor film is deposited by, for example, sputtering. After that, the semiconductor film is patterned by photolithography to form the semiconductor layer 24.

Next, at the gate insulating film forming step ST1-3, on the substrate provided with the semiconductor layer 24, a single-layer inorganic film or a multilayer inorganic film is deposited by, for example, the plasma CVD to form the gate insulating film 26.

Next, at the first conductive layer forming step ST1-4, on the substrate provided with the gate insulating film 26, a single-layer metal film or a multilayer metal film is deposited by, for example, sputtering to form a conductive film. Then, the conductive film is patterned by photolithography to form the first conductive layer 28 (the plurality of gate wires 28*g*1, the plurality of emission control wires 28*el*, the plurality of first portion wires 28*al*, the plurality of gate electrodes 28*ge*, and the plurality of first capacitive electrodes 28*ce*). After that, the gate insulating film 26 is patterned either by dry etching using each of the gate electrodes 20*ge* as a mask, or by photolithography again.

Next, at the interlayer insulating film forming step ST1-5, on the substrate provided with the first conductive layer 28, a single-layer inorganic film or a multilayer inorganic film is deposited by, for example, the plasma CVD to form the interlayer insulating film 30. Then, the interlayer insulating film 30 is patterned by photolithography so that, for example, the contact holes 30*h* are formed in the interlayer insulating film 30. Simultaneously, a contact hole for connecting the first frame wire 32*fa* and the power supply wire 38*pl* is formed in the interlayer insulating film 30, and a portion of the interlayer insulating film 30 and the base coat film 22 is removed for forming the folding portion B.

Next, at the second conductive layer forming step ST1-6, on the substrate provided with the interlayer insulating film 30, a single-layer metal film or a multilayer metal film is deposited by, for example, sputtering to form a conductive film. Then, the conductive film is patterned by photolithography to form the second conductive layer 32 (the plurality of source wires 32*sl*, the first frame wire 32*fa*, the second frame wire 32*fb*, the plurality of source electrodes 32*se*, the plurality of drain electrodes 32*de*, and the plurality of second capacitive electrodes 32*ce*).

Figure 12:
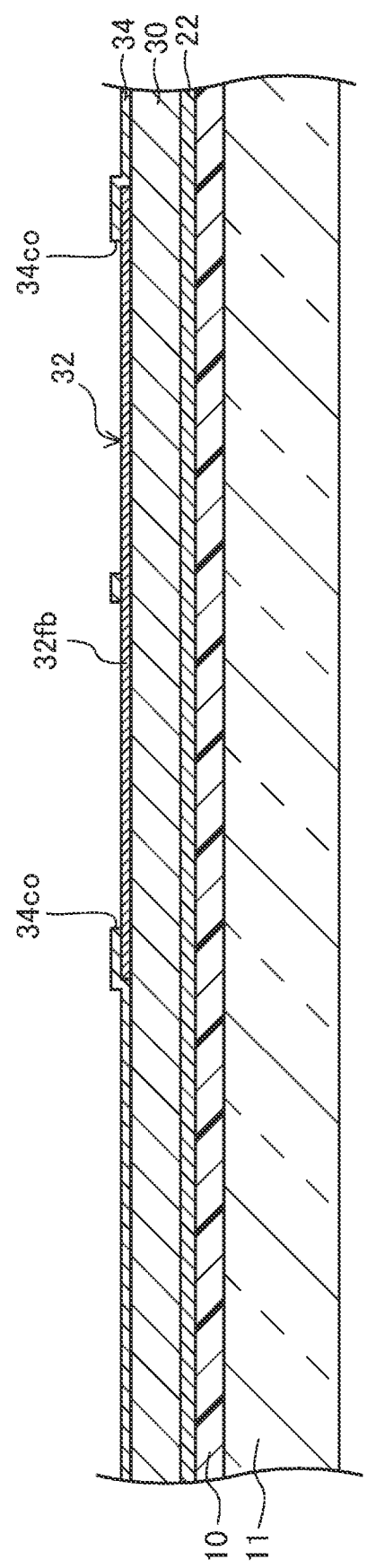
FIG. 12 is a cross-sectional view of an essential portion of a protective film including a connecting opening formed at a protective film forming step in the method for manufacturing the organic EL display device according to the first embodiment.

FIG. 12 is a cross-sectional view of an essential portion of the protective film 34 including the connecting opening 34*co* formed at the protective film forming step ST1-7. Next, at the protective film forming step ST1-7, on the substrate provided with the second conductive layer 32, a single-layer inorganic film or a multilayer inorganic film is deposited by, for example, the plasma CVD to form the protective film 34. Then, the protective film 34 is patterned by photolithography, so that, as illustrated in FIG. 12, the connecting opening 34*co* is formed in the protective film 34. Simultaneously, a contact hole for connecting the first frame wire 32*fa* and the power supply wire 38*pl* is formed in the protective film 34, and a portion of the protective film 34 is removed for the folding portion B.

Figure 13:
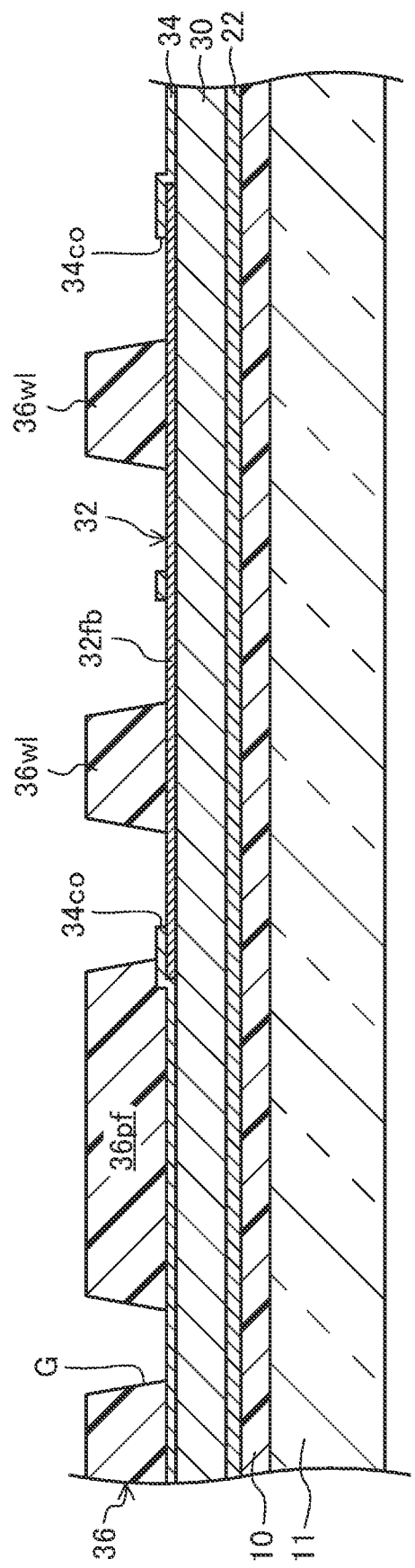
FIG. 13 is a cross-sectional view of an essential portion of a first resin wall layer formed at a first resin layer forming step in the method for manufacturing the organic EL display device according to the first embodiment.

FIG. 13 is a cross-sectional view of an essential portion of the first resin wall layer 36*wl* formed at the first resin layer forming step ST1-8. Next, at the first resin layer forming step ST1-8, the substrate provided with the protective film 34 is coated with a photosensitive resin material by, for example, such a known technique as spin-coating. Then, the coating film of the photosensitive resin material is pre-baked, exposed to light, developed, and post-baked. The coating film is patterned to form, as illustrated in FIG. 13, the first resin layer 36 (the first planarization film 36*pf* and the first resin wall layer 36*wl*). Here, the pre-baking and the post-baking are heat treatments to heat the coating film at a high temperature of, for example, 80 to 200° C. (the same applies hereinafter). This first resin layer forming step ST1-8 corresponds to a first resin wall layer forming step.

Figure 14:
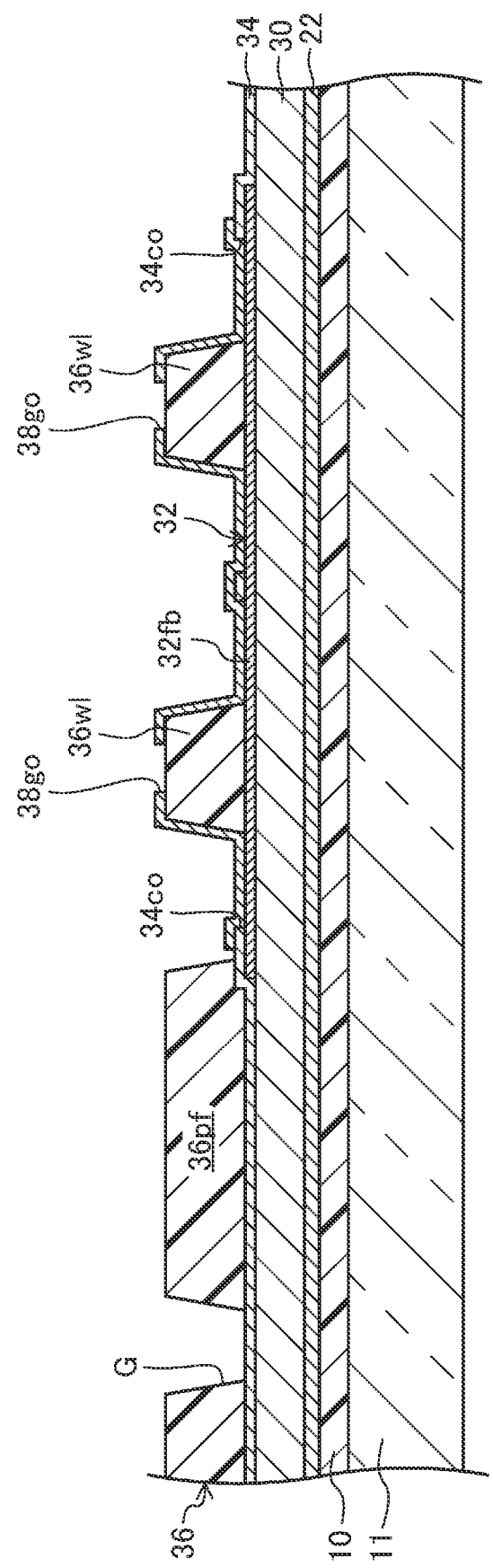
FIG. 14 is a cross-sectional view of an essential portion of a first conductive wall layer formed at a third conductive layer forming step in the method for manufacturing the organic EL display device according to the first embodiment.

FIG. 14 is a cross-sectional view of an essential portion of the first conductive wall layer 38*wl* formed at the third conductive layer forming step ST-9. Next, at the third conductive layer forming step ST1-9, on the substrate provided with the first resin layer 36, a single-layer metal film or a multilayer metal film is deposited by, for example, sputtering to form a conductive film. Then, the conductive film is patterned by photolithography to form, as illustrated in FIG. 14, the third conductive layer 38 (the power supply wire 38*pl*, the plurality of second portion wires 38*bl*, the plurality of relay conductive layers 38*cl*, and the first conductive wall layer 38*wl*). This third resin layer forming step ST1-9 corresponds to a first conductive wall layer forming step. At the third conductive layer forming step ST1-9, the conductive wall layer 38*wl* is formed to cover the first resin wall layer 36*wl*.

Figure 15:
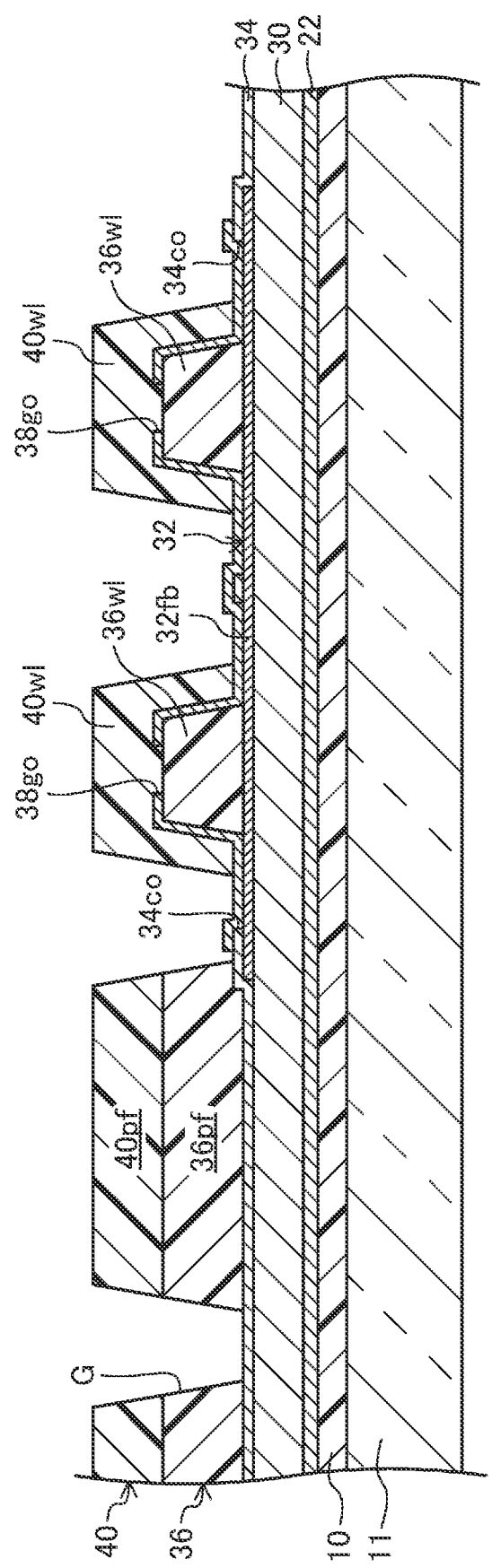
FIG. 15 is a cross-sectional view of an essential portion of a second resin wall layer formed at a second resin layer forming step in the method for manufacturing the organic EL display device according to the first embodiment.

FIG. 15 is a cross-sectional view of an essential portion of the second resin wall layer 40*wl* formed at the second resin layer forming step ST1-10. Next, at the second resin layer forming step ST1-10, the substrate provided with the third conductive film 38 is coated with a photosensitive resin material by, for example, such a known technique as spin-coating. Then, the coating film of the photosensitive resin material is pre-baked, exposed to light, developed, and post-baked. The coating film is patterned to form, as illustrated in FIG. 15, the second resin layer 40 (the second planarization film 40*pf* and the second resin wall layer 40*wl*). This second resin layer forming step ST1-10 corresponds to a second resin wall layer forming step. At the second resin layer forming step ST1-10, the second resin wall layer 40*wl* is formed over the first resin wall layer 36*wl* through the first conductive wall layer 38*wl*, and positioned between: the step portion 38*sp* included in the first conductive wall layer 38*wl* and covering the peripheral end face of the first resin wall layer 36*wl*; and the step portion 62*sp* included in the second conductive wall layer 62*wl* to be formed later and corresponding to the step portion 38*sp* of the first conductive wall layer 38*wl*.

Hence, at the TFT layer forming step ST1, the resin substrate layer 20 is formed on the resin substrate layer 10.

Light-Emitting-Element Layer Forming Step

Figure 16:
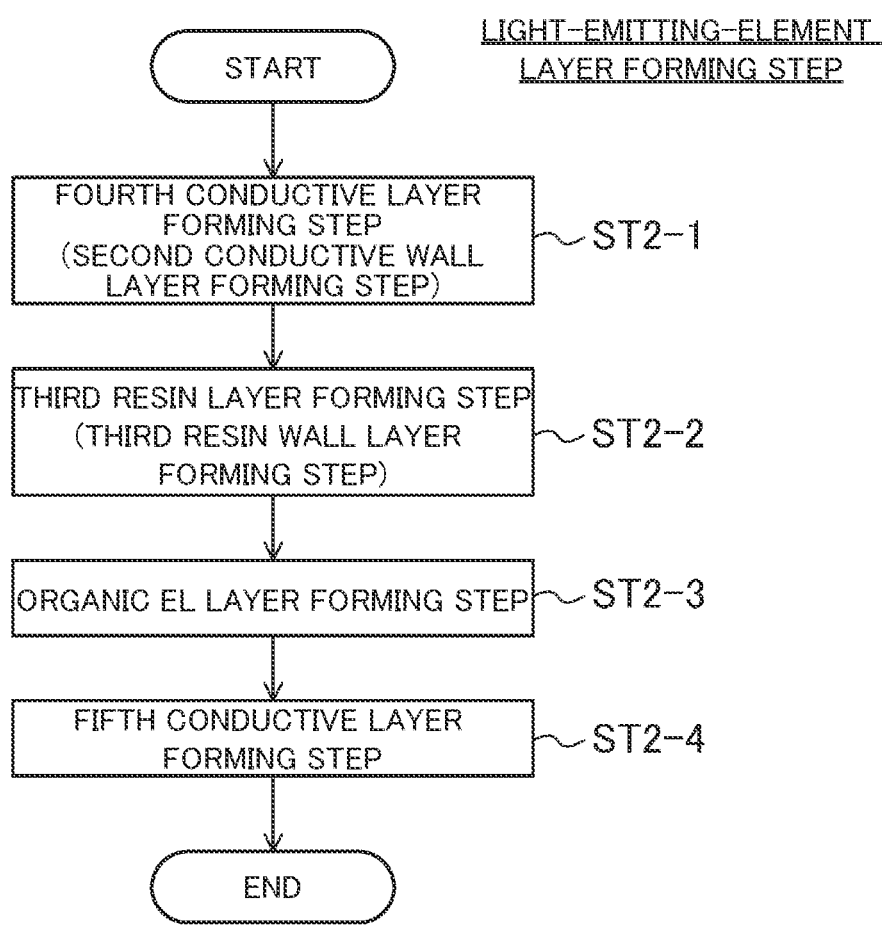
FIG. 16 is a flowchart schematically showing a light-emitting-element layer forming step in the method for manufacturing the organic EL display device according to the first embodiment.

FIG. 16 is a flowchart schematically showing the light-emitting-element layer forming step ST2. As illustrated in FIG. 16, the light-emitting-element layer forming step ST2 includes: a fourth conductive layer forming step ST2-1; a third resin layer forming step ST2-2; an organic EL layer forming step ST2-3; and a fifth conductive layer forming step ST2-4.

Figure 17:
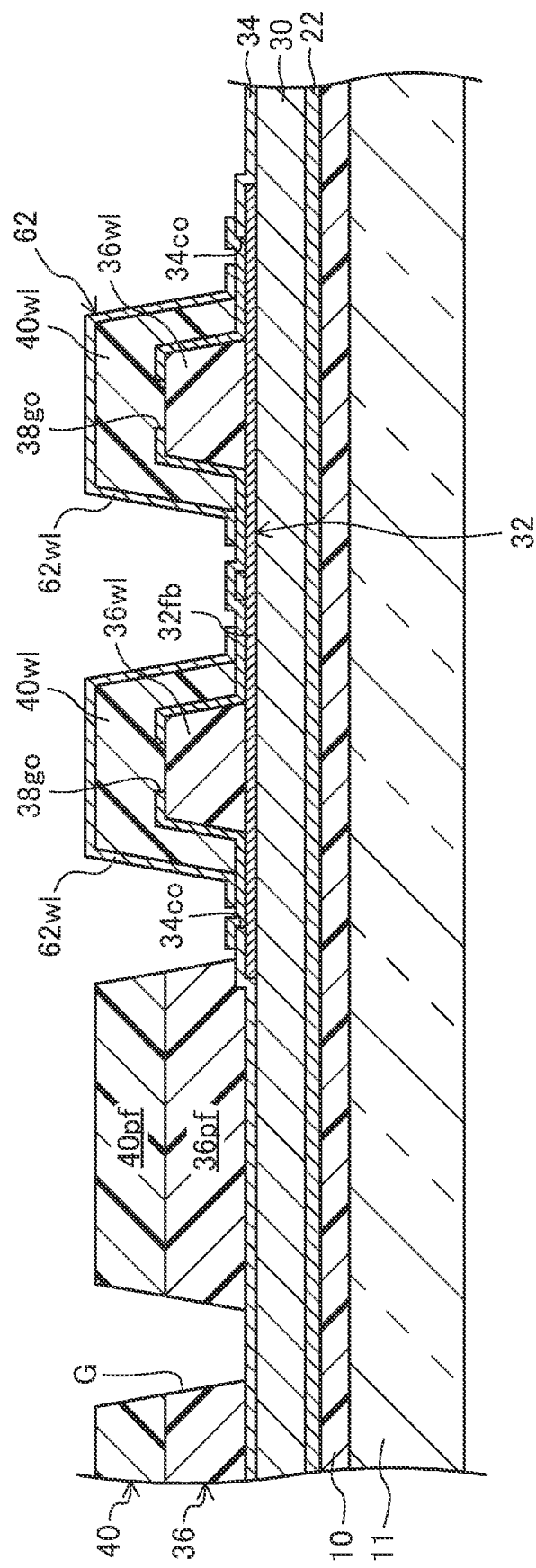
FIG. 17 is a cross-sectional view of an essential portion of a second conductive wall layer formed at a fourth conductive layer forming step in the method for manufacturing the organic EL display device according to the first embodiment.

FIG. 17 is a cross-sectional view of an essential portion of the second conductive wall layer 62*wl* formed at the fourth conductive layer forming step ST2-1. At the fourth conductive layer forming step ST2-1, on the substrate provided with the TFT layer 20, a single-layer conductive oxide layer, a single-layer metal layer, a multilayer conductive oxide layer, or a multilayer metal layer is deposited by, for example, sputtering to form a conductive film. Then, the conductive film is patterned by photolithography to form, as illustrated in FIG. 17, the fourth conductive layer 62 (the plurality of first electrodes 62*fe* and the second conductive wall layers 62*wl*). This fourth conductive layer forming step ST2-1 corresponds to a second conductive wall layer forming step. At the fourth conductive layer forming step ST2-1, the second conductive wall layers 62*wl* are formed to cover the second resin wall layer 40*wl*.

Figure 18:
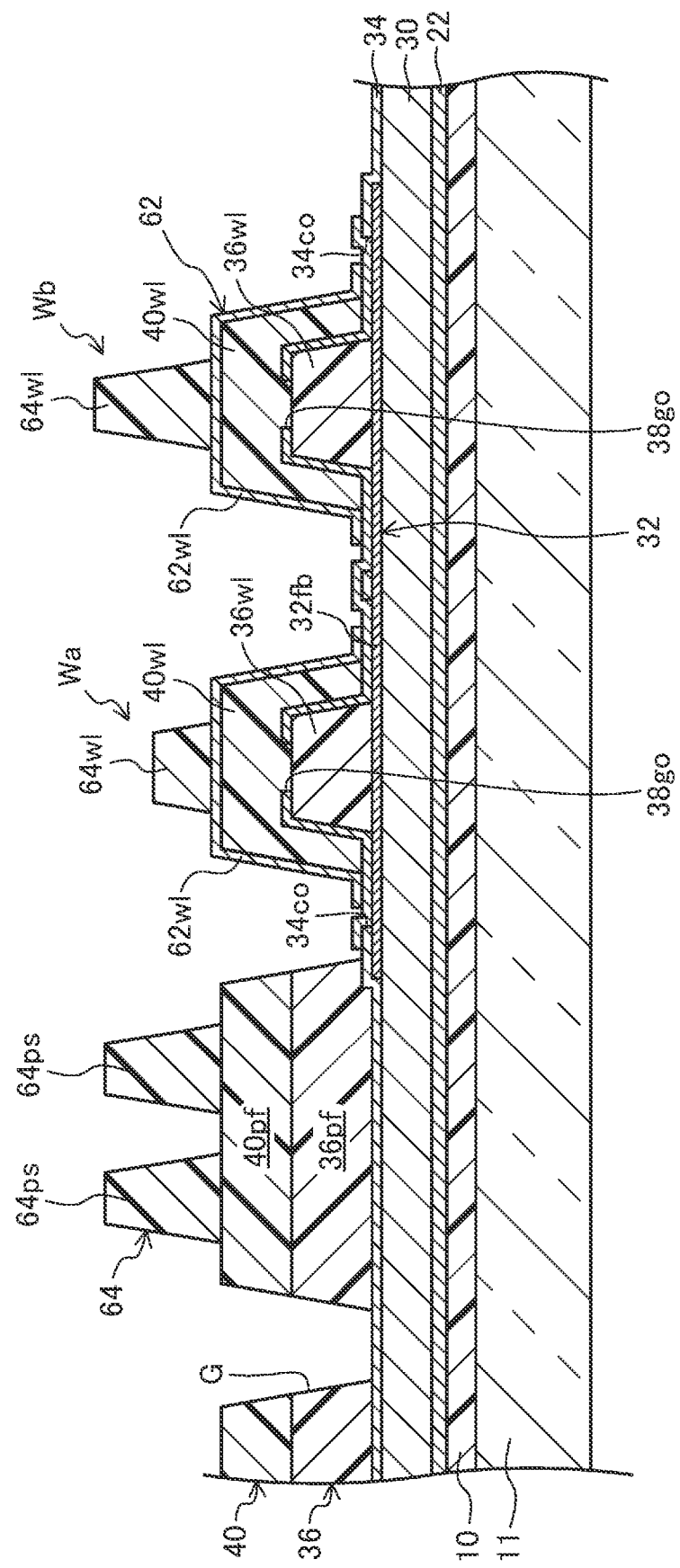
FIG. 18 is a cross-sectional view of an essential portion of a third resin wall layer formed at a third resin layer forming step in the method for manufacturing the organic EL display device according to the first embodiment.

FIG. 18 is a cross-sectional view of an essential portion of the third resin wall layer 64*wl* formed at the third resin layer forming step ST2-2. Next, at the third resin layer forming step ST2-2, the substrate provided with the fourth conductive film 62 is coated with a photosensitive resin material by, for example, such a known technique as spin-coating. Then, the coating film of the photosensitive resin material is pre-baked, exposed to light, developed, and post-baked. The coating film is patterned to form, as illustrated in FIG. 18, the third resin layer 64 (the edge cover 64*ec*, the photo spacers 64*pc*, and the third resin wall layer 64*wl*). This third resin layer forming step ST2-2 corresponds to a third resin wall layer forming step.

Next, at the organic EL layer forming step ST2-3, on the substrate provided with the third resin layer 64, the hole-injection layer 66*a*, the hole-transport layer 66*b*, the light-emitting layer 66*c*, the electron-transport layer 66*d*, and the electron-injection layer 66*e* are deposited in the stated order by, for example, vacuum deposition, using a deposition mask referred to as a fine metal mask (FMM) allowing patterning by sub-pixel. The deposited layers form the organic EL layer 66 on the each individual first electrode 62*fe* inside the opening 64*eo* of the edge cover 64*ec*. Note that some of the hole-injection layer 66*a*, the hole-transport layer 66*b*, the electron-transport layer 66*d*, and the electron-injection layer 66*e* may be deposited, using a deposition mask referred to as a common metal mask (CMM) that allows patterning by display panel.

Next, at the fifth conductive layer forming step ST2-4, on the substrate provided with the organic EL layer 66, a single-layer metal film or a multilayer metal film is deposited by, for example, vacuum deposition, using a deposition mask (CMM). The deposited metal film forms the fifth conductive layer 68 (the second electrode 68*se*).

Hence, at the light-emitting-element layer forming step ST2, the light-emitting-element layer 60 is formed on the TFT layer 20.

Sealing Film Forming Step

At the sealing film forming step ST3, on the substrate provided with the light-emitting-element layer 60, a single-layer inorganic insulating film or a multilayer inorganic insulating film is deposited by, for example, the CVD, using a deposition mask (CMM). The deposited film forms the first inorganic layer 82. Then, the substrate provided with the first inorganic layer 82 is coated with an organic material by ink-jet printing. The organic material forms the organic layer 84. Then, on the substrate provided with the organic layer 84, a single-layer inorganic insulating film or a multilayer inorganic insulating film is deposited by, for example, the CVD, using a deposition mask (CMM). The deposited film forms the second inorganic layer 86.

Hence, at the sealing film forming step ST3, the sealing film 80 is formed to include the first inorganic layer 82, the organic layer 84, and the second inorganic layer 86 stacked on top of another.

Flexible Step

At the flexible step ST4, a laser beam is emitted through the glass substrate 100 on the back face of the substrate provided with the sealing film 80, in order to remove the glass substrate 100 from the back face of the resin substrate layer 10. Then, to the back face of the resin substrate layer with the glass substrate 100 removed, the protective film 12 is attached.

Mounting Step

At the mounting step ST5, the wiring board Cb is connected to the terminal unit T of the substrate with the glass substrate 100 removed, using such a conductive material as an anisotropic conductive film (ACF) or an anisotropic conductive paste (ACF). The wiring board Cb and the terminal unit T are brought into conduction. Together with the wiring board Cb, an external circuit such as a display control circuit is mounted.

Through the above steps, the organic EL display device 1 of this embodiment can be manufactured.

Features of First Embodiment

According to the organic EL display device 1 of this first embodiment, each of the first dam wall Wa and the second dam wall Wb includes: the first conductive wall layer 38*wl* provided to cover the first resin wall layer 36*wl*; and the second conductive wall layer 62*wl* provided to cover the second resin wall layer 40*wl*. Hence, the first dam wall Wa and the second dam wall Wb can increase in mechanical strength.

According to the organic EL display device 1 of this first embodiment, the step portion 38*sp* included in the first conductive wall layer 38*wl* and covering the peripheral end face of the first resin wall layer 36*wl* and the step portion 62*sp* included in the second conductive wall layer 62*wl* and corresponding to the step portion 38*sp* of the first conductive wall layer 38*wl* are spaced apart from each other across the second resin wall layer 40*wl*. Such a feature can reduce delamination of the first conductive wall layer 38*wl* and the second conductive wall layer 62*wl* from each other caused by such thermal processing as pre-baking and post-baking in the steps of, for example, forming the second resin layer 40 and the third resin layer to be carried out after the formation of both of the conductive wall layers 38wl and 62wl. Hence, the yield in manufacturing the organic EL display devices 1 can improve.

At the steps of forming the second resin layer 40 and the third resin layer 64, a gas could be produced inside the previously formed first resin wall layer 36wl by the thermal processing (i.e. the pre-baking and the post-baking). When the gas is produced inside the first resin wall layer 36wl, if the first resin wall layer 36wl is completely covered with the first conductive wall layer 38wl, the produced gas will stay inside the first conductive wall layer 38wl. Hence, the first conductive wall layer 38wl might partially be lifted or delaminated.

In contrast, according to the organic EL display device 1 of this first embodiment, the first conductive wall layer 38wl includes the degassing opening 38go. Hence, the gas produced inside the first resin wall layer 36wl by the thermal processing is released through the degassing opening 38go to the second resin wall layer 40wl. Such a feature can keep the gas from staying inside the first conductive wall layer 38wl, making it possible to prevent the first conductive wall layer 38wl from being partially lifted or delaminated. This is advantageous for improving the yield in manufacturing the organic EL display devices 1.

Second Embodiment

Figure 19:
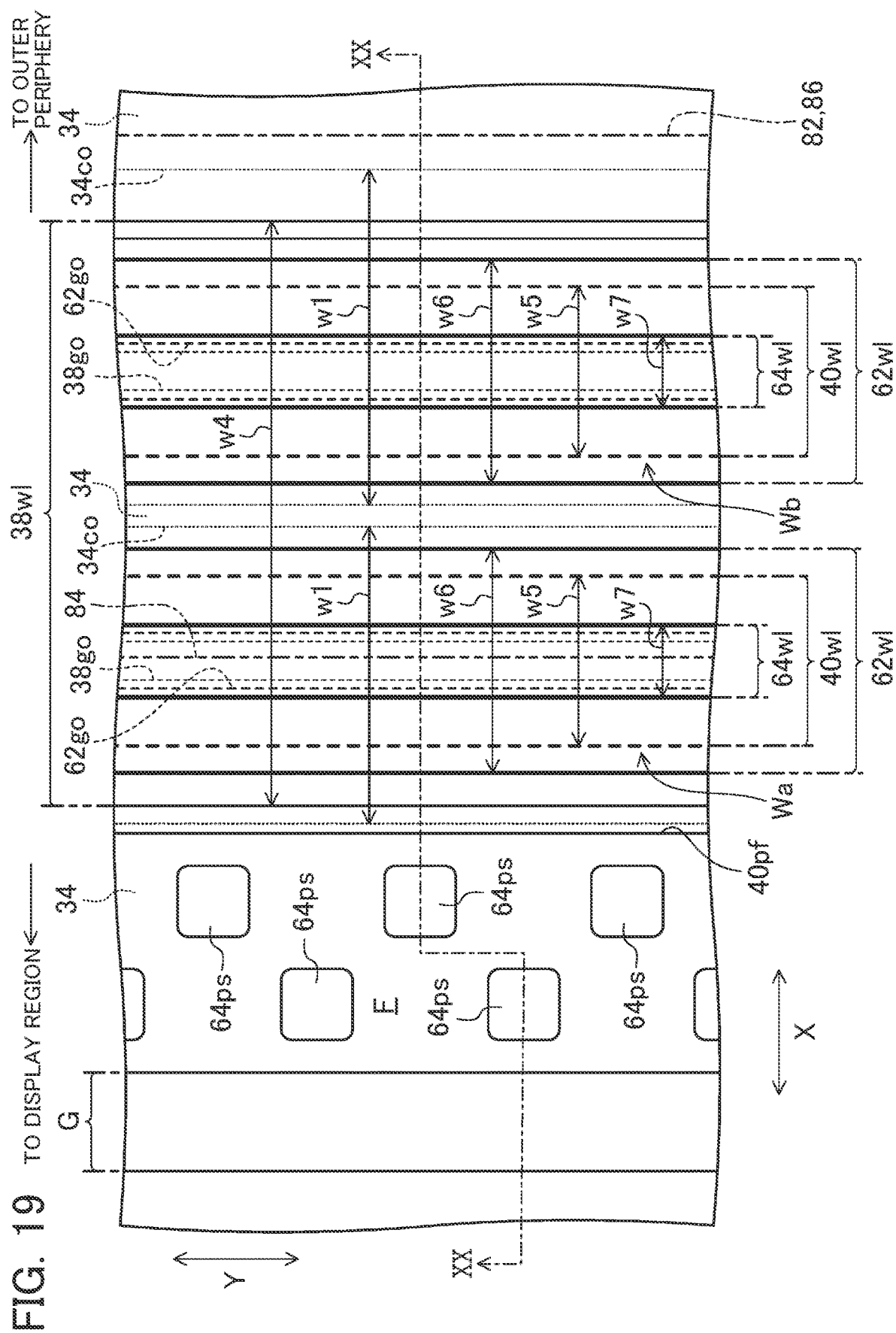
FIG. 19, corresponding to FIG. 8, is a plan view of the organic EL display device according to a second embodiment.

The organic EL display device 1 of this second embodiment is different in configuration of the second conductive wall layer 62wl from that of the first embodiment. Note that the organic EL display device 1 of this second embodiment is the same in configuration as that of the first embodiment except for the configuration of the second conductive wall layer 62wl. FIG. 19, corresponding to FIG. 8, is a plan view of the organic EL display device 1 according to this second embodiment. FIG. 20 is a cross-sectional view of the organic EL display device 1, taken from line XX-XX in FIG. 19.

As illustrated in FIGS. 19 and 20, the second conductive wall layers 62wl include a degassing opening for each second resin wall layer 40wl. The degassing opening 62go corresponds to a second opening. The degassing opening 62go is a slit opening extending in the longitudinal direction of the corresponding first dam wall Wa and second dam wall Wb. Each third resin wall layer 64wl in the corresponding first dam wall Wa or second dam wall Wb covers the degassing opening 62go formed in the second conductive wall layer 62wl.

Each degassing opening 62go is shaped into a continuous frame. Each degassing opening 62go may be divided into a plurality of openings so that the divided openings form a frame as a whole. Each degassing opening 62go partially exposes an upper face of the second resin wall layer 40wl from the second conductive wall layer 62wl. The second conductive wall layer 62wl allows the degassing opening 62go to expose a center portion on the upper face of the second resin wall layer 40wl in the transverse direction, and covers both side portions of the second resin wall layer 40wl in the transverse direction. The degassing opening 62go formed in each second conductive wall layer 62wl corresponds, through the second resin wall layer 40wl, to the degassing opening 38go formed in the first conductive wall layer 38wl.

The organic EL display device 1 of this embodiment can be manufactured in the same manner as the organic EL display device 1 of the first embodiment 1.

Features of Second Embodiment

In manufacturing the organic display device 1, at the step of forming the third resin layer 64, a gas could be produced also inside the previously formed second resin wall layer 40wl by the thermal processing (i.e. the pre-baking and the post-baking). When the gas is produced inside the second resin wall layer 40wl, if the second resin wall layer 40wl is completely covered with the second conductive wall layer 62wl, the produced gas will stay inside the second conductive wall layer 62wl. Hence, the second conductive wall layer 62wl might partially be lifted or delaminated.

In contrast, according to the organic EL display device 1 of this second embodiment, the second conductive wall layer 62wl also includes the degassing opening 62go. Hence, the gas produced inside the second resin wall layer 40wl by the thermal processing is released through the degassing opening 62go to the third resin wall layer 64wl. Such a feature can keep the gas from staying inside the second conductive wall layer 62wl, making it possible to prevent the second conductive wall layer 62wl from being partially lifted or delaminated. This is advantageous for improving the yield in manufacturing the organic EL display devices 1.

Other Embodiments

As to the organic EL display device 1 of each of the above embodiments, the degassing opening 38go formed in the first conductive wall layer 38wl is a slit opening. However, the degassing opening 38go may be a plurality of circular openings or a plurality of rectangular openings arranged at predetermined intervals. The same applies to the degassing opening 62go formed in the second conductive wall layer 62wl according to the organic EL display device 1 of the second embodiment.

As to the organic EL display device 1 of each of the above embodiment, both the first dam wall Wa and the second dam wall Wb include the third resin wall layer 64wl. However, one of the first dam wall Wa or the second dam wall Wb does not have to include the third resin wall layer 64wl. Alternatively, neither the first dam wall Wa nor the second dam wall Wb has to include the third resin wall layer 64wl.

In the organic EL display device 1 of each of the above embodiments, as dam walls, the first dam wall Wa and the second dam wall Wb are provided. The dam walls may include three or more of dam walls, such that a third dam wall may further be provided on the outer periphery of the second dam wall Wb. The first dam wall Wa may be the only dam wall to be provided.

In the organic EL display device 1 of each of the embodiments, the organic EL layer 66 is individually provided for each of the sub-pixels Sp. Alternatively, the organic EL layer 66 may be continuously provided in common among the plurality of sub-pixels Sp including the light-emitting layer 66c. In such a case, the organic EL display device 1 may include, for example, a color filter to represent a color tone of each of the sub-pixels Sp.

In the organic EL display device 1 of each of the above embodiment, each pixel Px includes sub-pixels Sp in three colors. Alternatively, the sub-pixels Sp included in each pixel Px are not limited to have three colors. The sub-pixels Sp may have four or more colors. Moreover, the sub-pixels Sp included in each pixel Px and having three colors are arranged in a stripe. Alternatively, the plurality of sub-pixels Sp included in each pixel Px may be arranged in another manner, such as a PenTile layout.

In the organic EL display device 1 of each of the above embodiments, any of the first TFT 50A, the second TFT 50B, and the third TFT 50C is a top-gate TFT. Alternatively, the first TFT 50A, the second TFT 50B, and the third TFT 50C may be bottom-gate TFTs. Moreover, the sub-pixel Px may include two or fewer TFTs 50, or four or more TFTs.

In the organic EL display device 1 of each of the embodiments, the first electrode 62fe is an anode and the second electrode 68se is a cathode. Alternatively, the first electrode 62fe may be a cathode and the second electrode 68se may be an anode. In such a case, for example, the organic EL layer 66 has a reversed multilayer structure.

In the organic EL display device 1 of each of the above embodiments, the organic EL layer 66 has a five-layer multilayer structure including: the hole-injection layer 66a; the hole-transport layer 66b; the light-emitting layer 66c; the electron-transport layer 66d; and the electron-injection layer 66e. Alternatively, the organic EL layer 66 may have a three-layer multilayer structure including: a hole-injection-transport layer; the light-emitting layer 66c; and an electron-transport-injection layer. The organic EL layer 66 may have any given structure.

Each of the above embodiments exemplifies the organic EL display device 1 as a display device. However, the display device shall not be limited to the organic EL display device 1. The technique disclosed in the present disclosure is applicable to a display device including a plurality of light-emitting elements driven by current. For example, the techniques of the present disclosure are applicable to a display device including quantum-dot light-emitting diodes (QLEDs); that is, light-emitting elements including a quantum-dot containing layer.

As can be seen, preferable embodiments are described above as examples of the techniques in the present disclosure. However, the techniques of the present disclosure shall not be limited to the above embodiments, and can be applicable to an embodiment that include appropriate modification, replacement, addition, and omission. Moreover, constituent features described in the above embodiments can be combined together to form a new embodiment. Furthermore, some of the constituent features illustrated in the attached drawings and recited in the detailed descriptions do not have to be essential to solve the problems. Hence, such non-essential constituent features illustrated in the attached drawings and recited in the detailed descriptions shall not be immediately interpreted as essential constituent features.

The invention claimed is:

1. A display device, comprising:
a substrate;
a thin-film transistor layer provided on the substrate and including a plurality of thin-film transistors;
a light-emitting-element layer provided on the thin-film transistor layer and including a plurality of light-emitting elements;
a sealing film provided on the light-emitting-element layer and including an organic layer; and
a display region configured to display an image when the plurality of light-emitting elements emits light, and a frame region provided out of the display region,
wherein the frame region includes a dam wall to surround the display region, and the organic layer is provided behind the dam wall,
the dam wall includes:
a first resin wall layer made of a resin material;
a first conductive wall layer made of a conductive material and provided to cover the first resin wall layer;
a second resin wall layer made of the resin material and provided over the first resin wall layer through the first conductive wall layer; and
a second conductive wall layer made of the conductive material and provided to cover the second resin wall layer,
the second resin wall layer is positioned between (i) a step portion included in the first conductive wall layer and covering a peripheral end face of the first resin wall layer, and (ii) a portion included in the second conductive wall layer and corresponding to the step portion,
the first conductive wall layer includes a first opening formed to expose an upper face of the first resin wall layer, and
a width of the second resin wall layer is greater than a width of the first resin wall layer.

2. The display device according to claim 1,
wherein at least one of the first conductive wall layer and the second conductive wall layer is provided to surround the display region.

3. The display device according to claim 1,
wherein the second resin wall layer covers all of the first resin wall layer in a transverse direction through the first conductive wall layer.

4. The display device according to claim 1,
wherein the first opening is a slit opening extending in a longitudinal direction of the dam wall.

5. The display device according to claim 1,
wherein the second conductive wall layer includes a second opening formed to expose an upper face of the second resin wall layer.

6. The display device according to claim 5,
wherein the second opening is a slit opening extending in a longitudinal direction of the dam wall.

7. The display device according to claim 1,
wherein the thin-film transistor layer includes:
a first planarization film provided to cover the plurality of thin-film transistors;
a conductive layer provided on the first planarization film; and
a second planarization film provided to cover the conductive layer,
the light-emitting-element layer includes:
a first electrode provided for each of the light-emitting elements;
a light-emitting functional layer provided on the first electrode; and
a second electrode provided on the light-emitting functional layer,
the first resin wall layer is formed in a same layer, and of a same material, as the first planarization film,
the first conductive wall layer is formed in a same layer, and of a same material, as the conductive layer,
the second resin wall layer is formed in a same layer, and of a same material, as the second planarization film, and
the second conductive wall layer is formed in a same layer, and of a same material, as the first electrode.

8. The display device according to claim 7,
wherein the light-emitting-element layer further includes an edge cover covering an edge portion of the first electrode and having an opening in which the light-emitting functional layer is provided, the dam wall further includes a third resin wall layer provided on the second conductive wall layer to overlap the second resin wall layer, and the third resin wall layer is formed in a same layer, and of a same material, as the edge cover.

9. The display device according to claim 1, wherein the light-emitting-element layer includes:
  a first electrode provided for each of the light-emitting elements;
  a light-emitting functional layer provided on the first electrode; and
  a second electrode provided on the light-emitting functional layer, the frame region further includes a frame wire provided below the first resin wall layer and electrically connected to the second electrode, and the first conductive wall layer is electrically connected to the frame wire on at least one of an inner periphery and an outer periphery of the first resin wall layer.

10. The display device according to claim 9, wherein the second conductive wall layer is electrically connected to the first conductive wall layer on at least one of an inner periphery and an outer periphery of the second resin wall layer.

11. A display device, comprising:

a substrate;

a thin-film transistor layer provided on the substrate and including a plurality of thin-film transistors;

a light-emitting-element layer provided on the thin-film transistor layer and including a plurality of light-emitting elements;

a sealing film provided on the light-emitting-element layer and including an organic layer; and a display region configured to display an image when the plurality of light-emitting elements emits light, and a frame region provided out of the display region, wherein the frame region includes a dam wall to surround the display region, and the organic layer is provided behind the dam wall, the dam wall includes:
  a first resin wall layer made of a resin material;
  a first conductive wall layer made of a conductive material and provided to cover the first resin wall layer;
  a second resin wall layer made of the resin material and provided over the first resin wall layer through the first conductive wall layer; and
  a second conductive wall layer made of the conductive material and provided to cover the second resin wall layer, the second resin wall layer is positioned between (i) a step portion included in the first conductive wall layer and covering a peripheral end face of the first resin wall layer and (ii) a portion included in the second conductive wall layer and corresponding to the step portion, the light-emitting-element layer includes:
  a first electrode provided for each of the light-emitting elements;
  a light-emitting functional layer provided on the first electrode; and
  a second electrode provided on the light-emitting functional layer, the frame region further includes a frame wire provided below the first resin wall layer and electrically connected to the second electrode, the first conductive wall layer is electrically connected to the frame wire on at least one of an inner periphery and an outer periphery of the first resin wall layer, the plurality of thin-film transistors includes:
  a semiconductor layer made of an oxide semiconductor;
  a gate insulating film provided to cover the semiconductor layer;
  a gate electrode provided on the gate insulating film to overlap the semiconductor layer;
  an interlayer insulating film provided to cover the gate electrode; and
  a source electrode and a drain electrode provided on the interlayer insulating film and electrically connected to different regions of the semiconductor layer, the thin-film transistor layer further includes a protective film provided to cover the plurality of thin-film transistors, the frame wire is formed in a same layer, and of a same material, as the source electrode and the drain electrode, the protective film includes a first opening formed to expose an upper face of the frame wire, the first conductive wall layer is electrically connected to the frame wire through the first opening, a width of the first opening is greater than a width of the first resin wall layer, the first resin wall layer is provided inside the first opening, a width of the first conductive wall is greater than the width of the first opening, and the first conductive wall layer is provided to cover the first opening on the inner periphery and the outer periphery of the first resin wall layer.

12. The display device according to claim 11, wherein the second conductive wall layer is electrically connected to the first conductive wall layer on at least one of an inner periphery and an outer periphery of the second resin wall layer.

13. The display device according to claim 11, wherein the first conductive wall layer and the second conductive wall layer have portions positioned in the frame region and facing across at least the display region from each other, the portions overlapping in contact with each other.

14. The display device according to claim 11, wherein the first opening is a slit opening extending in a longitudinal direction of the dam wall.

15. The display device according to claim 11, wherein the width of the first opening is smaller than a width of the frame wire, and the frame wire is exposed from the protective film across the first opening.

* * * * *